(12) United States Patent
Korgel et al.

(10) Patent No.: US 10,038,213 B2
(45) Date of Patent: Jul. 31, 2018

(54) GROUP IV METAL OR SEMICONDUCTOR NANOWIRE FABRIC

(75) Inventors: Brian A. Korgel, Round Rock, TX (US); Damon A. Smith, Austin, TX (US); Vincent C. Holmberg, Austin, TX (US); Reken Patel, Portland, OR (US); Paul Thurk, Austin, TX (US)

(73) Assignee: Pinion Technologies, Inc., Austin, TX (US)

(*) Notice: Subject to any disclaimer, the term of this patent is extended or adjusted under 35 U.S.C. 154(b) by 0 days.

(21) Appl. No.: 13/034,667

(22) Filed: Feb. 24, 2011

(65) Prior Publication Data

US 2011/0223484 A1 Sep. 15, 2011

Related U.S. Application Data

(60) Provisional application No. 61/308,104, filed on Feb. 25, 2010.

(51) Int. Cl.

| | |
|---|---|
| *H01M 4/38* | (2006.01) |
| *H01M 4/134* | (2010.01) |
| *B82Y 30/00* | (2011.01) |
| *H01L 29/06* | (2006.01) |
| *H01M 4/139* | (2010.01) |
| *B82Y 40/00* | (2011.01) |
| *H01M 10/0525* | (2010.01) |

(Continued)

(52) U.S. Cl.
CPC ......... *H01M 10/0525* (2013.01); *B82Y 30/00* (2013.01); *B82Y 40/00* (2013.01); *H01M 4/139* (2013.01); *H01M 4/38* (2013.01); *H01M 4/382* (2013.01); *H01M 4/386* (2013.01); *H01L 29/0665* (2013.01); *H01L 2924/0002* (2013.01); *H01M 4/134* (2013.01); *H01M 4/1395* (2013.01); *H01M 4/405* (2013.01); *Y10T 428/249921* (2015.04)

(58) Field of Classification Search
CPC ... B82Y 30/00; B82Y 40/00; H01L 21/02603; H01L 29/0669–29/68; H01L 29/413; Y10S 977/702–977/703; Y10S 977/813–977/814
USPC ............... 429/231.5; 438/478; 428/220–221, 428/364–401, 903; 977/762
See application file for complete search history.

(56) References Cited

U.S. PATENT DOCUMENTS

| | | | |
|---|---|---|---|
| 2006/0090787 A1* | 5/2006 | Onvural ........................ 136/212 |
| 2006/0188774 A1* | 8/2006 | Niu et al. ........................ 429/44 |
| 2006/0240218 A1* | 10/2006 | Parce .............................. 428/98 |

(Continued)

OTHER PUBLICATIONS

Smith, D; Mechanical, Electromechanical, and Optical Properties of Germanium Nanowires; Dec. 2009.*

(Continued)

*Primary Examiner* — Frank J Vineis
(74) *Attorney, Agent, or Firm* — John A. Fortkort; Fortkort & Houston PC

(57) ABSTRACT

A method is provided for making a fabric. The method comprises (a) providing a composition comprising a plurality of nanocrystals disposed in a liquid medium, the nanocrystals comprising a material elected from the group consisting of a Group IV element; (b) applying the composition to a porous substrate, thereby removing at least a portion of the liquid medium from the nanocrystals; and (c) removing the nanocrystals from the porous substrate as a self-supporting mass.

31 Claims, 34 Drawing Sheets

(51) Int. Cl.
*H01M 4/1395* (2010.01)
*H01M 4/40* (2006.01)

(56) References Cited

U.S. PATENT DOCUMENTS

| | | | |
|---|---|---|---|
| 2007/0190880 A1* | 8/2007 | Dubrow et al. | 442/181 |
| 2007/0232036 A1 | 10/2007 | Hashimoto et al. | |
| 2008/0081388 A1* | 4/2008 | Yasseri | H01L 31/03523 438/22 |
| 2008/0280169 A1 | 11/2008 | Niu et al. | |
| 2009/0143227 A1 | 6/2009 | Dubrow et al. | |
| 2009/0176159 A1 | 7/2009 | Zhamu et al. | |
| 2009/0305135 A1 | 12/2009 | Shi et al. | |

OTHER PUBLICATIONS

Lithium-Ion Batteries; accessed Aug. 1, 2013; http://www.physicscentral.com/explore/action/lithium.cfm.*

Suh, Y; Implantation and Activation of High Concentrations of Boron in Germanium; IEEE Transactions on Electron Devices, vol. 52, No. 11, Nov. 2005 2416-2421.*

Peelaers, H; Properties of B and P doped Ge Nanowires; Appl. Phys. Lett. 90, 263103 (2007).*

Schaadt, D. M.; Enhanced semiconductor optical absorption via surface plasmon excitation in metal nanoparticles; Applied Physics Letters 86, 063106 (2005) 1-3.*

Merriam Webster, "Paperlike", http://www.merriam-webster.com/dictionary/paperlike, accessed Aug. 8, 2013.*

Tradeget.com, Apparel Glossary—Crisp, http://textile.tradeget.com/glossary/glossary_c.html, accessed Aug. 8, 2013.*

Wang, D, Oxidation Resistant Germanium Nanowires: Bulk Synthesis, Long Chain Alkanethiol Functionalization, and Langmuir-Blodgett Assembly, J. Am. Chem. Soc. 2005, 127, 11871-11875.*

Chan, C., Nanowire Batteries for Next Generation Electronics, Electron Devices Meeting, 2008. IEDM 2008. IEEE International, Dec. 15-17, 2008.*

Kim, Improvement of silicon powder negative electrodes by copper electroless deposition for lithium secondary batteries, Journal of Power Sources 147 (2005) 227-233.*

Holmberg, V., Optical Properties of Silicon and Germanium Nanowire Fabric, The Journal of Physical Chemistry C, 2012 116 (42), 22486-22491 DOI: 10.1021/jp308231w.*

Lee, Byung Yang et al., "Integrated devices based on networks of nanotubes and nanowires"; NPG Asia Mater. 2(3) 103-111 (2010); www.natureasia.com/asia-materials/review; Jul. 22, 2010; 23 pages.

Mathews, Nripan et al., "Oxide nanowire networks and their electronic and optoelectronic characteristics"; The Royal Society of Chemistry, Nanoscale, 2010, 2, pp. 1984-1998.

Yan, Chaoyi et al., "Wide-bandgap Zn2GeO4 nanowire networks as efficient ultraviolet photodetectors with fast response and recovery time"; 2010 American Institute of Physics; Applied Physics Letters 96, 053108 (2010); 3 pages.

Zhai, Tianyou et al., "Recent developments in one-dimensional inorganic nanostructures for photodetectors"; Advanced Functional Materials 2010, 20, pp. 4233-4248.

Smith, Damon A. et al., "Young's Modulus and Size-Dependent Mechanical Quality Factor of Nanoelectromechaninical Germanium Nanowire Resonators"; 2008 American Chemical Society; Published on Web Jul. 1, 2008; 6 pages.

Chan, Candace K. et al.; "High Capacity Li Ion Battery Anodes Using Ge Nanowires"; Nano Letters, vol. 8, No. 1, 2008; pp. 307-309.

Chan, Candace K. et al.; "High performance lithium battery anodes using silicon nanowires"; Nature Nanotechnology, Letters, vol. 3, Jan. 2008; pp. 31-35.

Supplementary European Search Report dated Jul. 10, 2014; 13 pages.

Johnson, Derek C. et al.; "Synthesis of copper silicide nanocrystallites embedded in silicon nanowires for enhanced transport properties," received Sep. 16, 2009, accepted Dec. 7, 2009; first published as an Advance Article on the Web Jan. 20, 2010; DOI: 10.1039/b919281f; 6 pages.

* cited by examiner

Figure 8. SEM images of the edges of (a) thin and (b) thick Ge nanowire fabric.

Figure 9. (a,b) SEM images of sections of Ge nanowire paper.

US 10,038,213 B2

GROUP IV METAL OR SEMICONDUCTOR NANOWIRE FABRIC

CROSS-REFERENCE TO RELATED APPLICATIONS

The present application claims priority to U.S. Provisional Application Ser. No. 61/308,104 (Korgel et al.), entitled "GROUP IV METAL OR SEMICONDUCTOR NANOWIRE FABRIC", which was filed on Feb. 25, 2010, and which is incorporated herein by reference in its entirety.

NOTICE OF GOVERNMENT RIGHTS

The work described in the present disclosure was supported by the Air Force Research Laboratory (FA-8650-07-2-5061) and the Office of Naval Research (N00014-05-1-0857). The government may have certain rights in one or more of the inventions disclosed herein.

FIELD OF THE DISCLOSURE

The present disclosure relates generally to nanowires, and more particularly to fabrics comprising Group IV metal or semiconductor nanowires and to applications of these fabrics.

BACKGROUND OF THE DISCLOSURE

Nanoparticles in general, and nanowires in particular, have been the subject of considerable research in the materials sciences. Part of this interest stems from the fact that nanowires of many materials frequently exhibit properties that are dramatically different from the corresponding bulk materials.

By way of example, germanium (Ge), like nearly all known ceramics, is a brittle material[1], and only exhibits measurable ductility[2] at high temperatures (greater than 350° C.). These properties result from the directional, covalent bonding between germanium atoms in the crystalline lattice, which blocks the nucleation and movement of dislocations necessary for plastic deformation (the Peierls force). Therefore, unless the temperature is very high, a bulk crystal of Ge fractures when it is deformed just past its yield point.[3] Ge also tends to be relatively fragile, with room temperature fracture strengths of only 40 to 95 MPa. These fracture strengths are orders of magnitude less than the ideal strength expected for a perfect Ge crystal of 14-20 GPa,[4, 5] and are attributable to the fact that Ge crystals have a variety of nearly unavoidable defects and stresses that serve as sources for crack formation and propagation.

In contrast to bulk Ge, crystalline nanowires of Ge, like those of many other semiconductors, are mechanically flexible due to their nanoscale dimensions. These nanowires are also too small to support defect concentrations similar to bulk materials, and are therefore extremely strong. In fact, the strength of Ge nanowires is close to the ideal strength of a perfect Ge crystal.

BRIEF DESCRIPTION OF THE DRAWINGS

FIG. 6a is an SEM image of a cantilevered Ge nanowire bent to a high strain position and pinned to the SiN substrate by Van der Waals forces.

FIG. 6b is an HRTEM image of the Ge nanowire of FIG. 6a showing the region of highest strain area with the presence of crack formation.

FIG. 6c is an HRTEM image of the Ge nanowire of FIG. 6a showing the region of highest strain area with the presence of crack formation.

FIG. 6d is an HRTEM image showing the delineation between the diamond-cubic and amorphous phases (see dotted line) in the Ge nanowire of FIG. 6a.

FIG. 26(A) is a representative SEM image of a mass of Si nanowires.

SUMMARY OF THE DISCLOSURE

Figure 1:
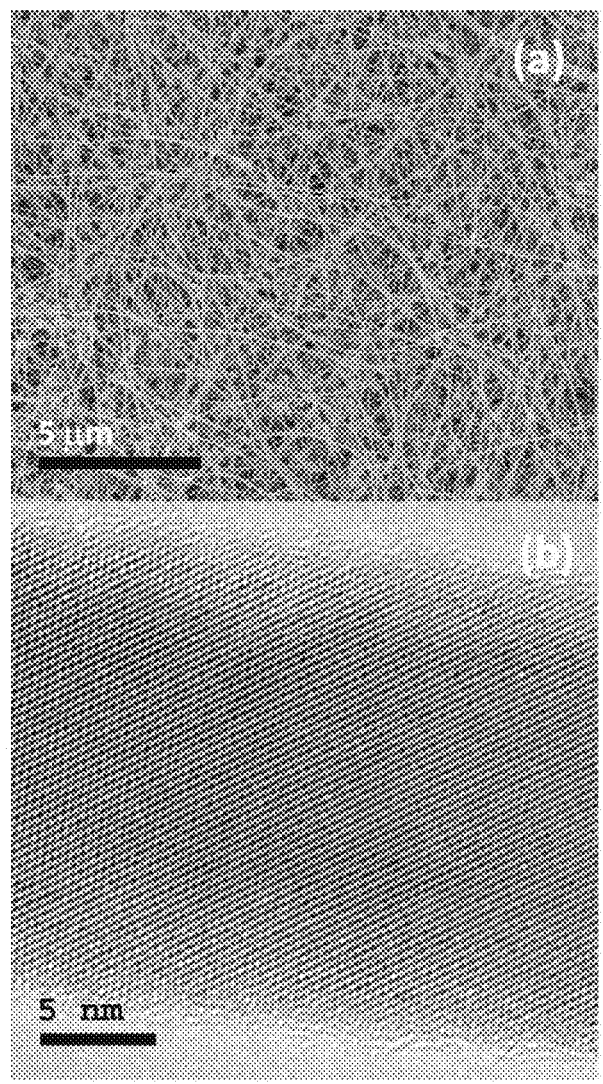
FIG. 1a is an SEM image of Ge nanowires used for the mechanical property tests described herein.
FIG. 1b is an HRTEM image of Ge nanowires used for the mechanical property tests described herein.

In one aspect, a fabric is provided which comprises a self-supporting mass of Group IV semiconductor nanowires.

In another aspect, a method is provided for making a fabric. The method comprises (a) providing a composition comprising a plurality of nanocrystals disposed in a liquid medium, the nanocrystals comprising a material elected from the group consisting of a Group IV element; (b) applying the composition to a porous substrate, thereby removing at least a portion of the liquid medium from the nanocrystals; and (c) removing the nanocrystals from the porous substrate as a self-supporting mass.

In a further aspect, a method is provided for making a fabric from Group IV metal or semiconductor nanostructures. The method comprises (a) providing a plurality of seed particles; (b) reacting the seed particles in a supercritical fluid mixture comprising at least one Group IV metal or semiconductor precursor such that metal or semiconductor nanostructures grow from the seed particles; (c) isolating the nanostructures from the fluid mixture by passing the fluid mixture through a porous substrate; and (d) removing the nanostructures from the porous substrate as a self-supporting mass.

In yet another aspect, a fabric is provided which comprises a plurality of crystalline, Group IV metal or semiconductor nanostructures, wherein each of said nanostructures has an aspect ratio, defined as the ratio of the length of the nanostructure to the width of the nanostructure, of at least 4, and wherein the fabric is a self-supporting mass.

In still another aspect, a method is provided for making a construct from a plurality of Group IV nanostructures. The method comprises (a) creating a suspension of nanostructures in a volatile solvent medium; (b) applying the suspension to a release liner; (c) removing at least a portion of the solvent, thereby forming a mass of nanostructures on the release liner; and (d) removing the mass of nanostructures from the release liner as a self-supporting mass.

In a further aspect, a rechargeable battery is provided which comprises an anode, a cathode and an electrolyte, wherein at least one of said anode and said cathode comprises a nanowire fabric comprising a Group IV element.

In still another aspect, a self-supporting mass is provided which comprises nanowires of a Group IV semiconductor.

DETAILED DESCRIPTION

Although considerable research has been devoted to nanoparticles in general and to nanowires in particular, much less attention has been paid to bulk constructs derived from these materials. This is especially true with respect to nanowires comprising Group IV metals and semiconductors, and is particularly true with respect to nanowires comprising Si and Ge. This result is at least partially due to the lack of availability of significant quantities of these materials, due to the challenges attendant to synthesizing them.

This situation has begun to change with the development of solvent-based synthetic methods for Group IV nanowires. One of the first approaches of this type featured the VLS-like growth of semiconductor nanowires, called supercritical fluid-liquid-solid (SFLS) growth.[9, 10] This approach is described in commonly assigned U.S. Pat. No. 7,858,181 (Hanrath et al.), entitled "Growth of Single Crystal nanowires", which is incorporated herein by reference in its entirety. Refinements to this technology have led to newer, low temperature methods for synthesizing these materials, such as those described in commonly assigned U.S. Ser. No. 11/582,132 (Fanfair et al.), which is incorporated herein by reference in its entirety.

These new synthetic methods have facilitated the development of bulk constructs comprising Group IV nanowires by enabling larger quantities of such nanowires to be readily synthesized. For example, even on the laboratory scale, more than 1 g of Ge nanowires can be produced in a single reaction carried out in a 250 mL vessel using these methods. Hence, these developments have allowed the unique mechanical properties of such nanowires to be leveraged in new applications and in new contexts. In particular, these developments have enabled the production of papers, fabrics, polymer composites, yarns, and other such bulk constructs which require high strength and toughness, and yet utilize the unique optical and electronic properties of semiconductor nanowires. Several examples of such constructs are described herein.

As indicated above, nanowires differ from their bulk counterparts in their limited size and high surface area to volume ratios, and hence do not have the same defects and stresses as bulk crystals. Consequently, nanowires often exhibit dramatic differences in mechanical properties compared to bulk crystals. Thus, nanowires exhibit fracture strengths which, in many cases, are close to those of an ideal perfect crystal[11, 12, 13, 14, 15, 16, 17] and do not sustain dislocations like their bulk counterparts.

For example, plastic deformation has been observed in Si nanowires at room temperature.[18, 19] By contrast, as shown herein, Ge nanowires also exhibit room temperature plasticity under certain bending conditions, enabled by an unusual mechanism of lattice amorphization,[20] and are also found to exhibit ideal strengths. These Ge nanowires thus represent a type of mechanically flexible ceramic. Hence, the ability to make significant quantities of such nanowires provides the opportunity to create a new class of materials, namely, bendable fabrics and flexible constructs comprising crystalline inorganic semiconductors.

TABLE 1 shows a list of selected materials and their room temperature mechanical properties of elastic modulus, tensile strength, failure strain, and strength-to-weight ratio. A tremendous amount of attention has been paid to single- and multiwall carbon nanotubes as new structural reinforcements because of their incredibly high strength-to-weight ratio. However, carbon nanotubes (particularly single wall nanotubes) remain relatively expensive to produce, and can be very difficult to disperse in solvents, polymers or other host materials.[21] Moreover, carbon nanotubes are typically electrically conductive.

Semiconductor nanowires, such as Ge nanowires, should also exhibit very high strength-to-weight ratios—on par with KEVLAR™ para-aramid synthetic fibers. Such nanowires can be dispersed relatively easily in various solvents by coating their surfaces with ligands[i] and, as a result of their semiconductor properties, are attractive in a wide range of applications, especially within the microelectronics field. Nonetheless, relatively little attention has been paid to these materials for structural applications, partially due to the lack, until recently, of suitable synthetic methods to make Group IV nanowires, and especially Group IV semiconductor nanowires, in large quantities.

TABLE 1

Mechanical properties (measured) of selected fibers, nanotubes, and nanowires.

| Material | Elastic Modulus (GPa) | Tensile Strength (GPa) | Failure Strain (%) | Strength-to-Weight Ratio (kN · m/kg) |
| --- | --- | --- | --- | --- |
| KEVLAR 49[a] | 125 | 3.5 | 2.3 | 24.3 |
| NOMEX[a] | 10 | 0.5 | 22 | 3.6 |
| E-GLASS[a] | 75 | 3.5 | 4 | 13.6 |
| Aluminum Oxide[a] | 350-380 | 1.7 | — | 4.6 |
| Carbon Fiber T-300[a] | 235 | 3.2 | 1.4 | 18.2 |
| Carbon Fiber M60J[a] | 585 | 3.8 | 0.7 | 19.6 |
| Stainless Steel (18-8)[a] | 198 | 1.0-1.4 | — | 1.8 |
| Tungsten[a] | 360 | 5.5 | — | 0.28 |
| SWCNT/MWCNT[b] | ~1000 | 11-63 | 5-12 | 85-485 |
| Si nanowire[c] | 187 | 12 | 7 | 51.5 |
| Ge nanowire | 106[d] | 18[e] | 17[e] | 33.8[e] |

[a]from footnote[23];
[b]from footnote[24];
[c]from footnote[25];
[d]from footnote[26];
[e]disclosed herein.

As noted above, semiconductor nanowires are typically flexible and strong, even though the corresponding bulk materials are characteristically brittle, and their distinct combination of electronic, optical and mechanical properties has the potential to enable a variety of new device technologies, including next generation flexible electronics, nanoelectromechanical systems (NEMS), piezoelectronics, and structural materials.[27, 28, 29, 30, 31, 32] Some measurements of the mechanical properties of individual nanowires may be found in the literature.[33, 34] However, there is still a need for accurate quantitative data, especially considering that different synthetic routes can produce nanowires (of the same material) with varying properties depending on subtle aspects of the materials, like crystallographic growth direction, defects, and surface chemistry. The mechanical properties of Group IV nanowires (such as, for example, SFLS-grown Ge nanowires) under significant load are of particular interest here, since these properties have a direct bearing on the properties of fabrics and other bulk constructs made from these nanowires. Hence, the mechanical properties of these materials are described below.

Materials

The following materials were utilized in the examples described herein.

Diphenylgermane was purchased from Gelest Inc., Morrisville, Pa.

Hydrogen tetrachloroaurate (III) trihydrate, tetraoctylammonium bromide, sodium borohydride, toluene, anhydrous benzene, 1-dodecanethiol, 1-dodecene, 11-mercaptoundenoic acid, dimethylsulfoxide, N-hydroxysuccinamide, and N-(3-dimethylaminopropyl)-N'-ethylcarbodiimide hydrochloride were purchased from Sigma-Aldrich Inc., St Louis, Mo.

Octacosane (99%), squalane (99%), trioctylphosphine (90%), anhydrous benzene (99.8%), dodecylamine (98%), dodecene (≥99.0%), tridodecylamine (85%), dodecanethiol (≥98%), gold tetrachloroaurate trihydrate (99.9+%), sodium borohydride (98+%), toluene (99.8%), dodecanethiol (≥98%), methanol (99.9%), chloroform (99.9%), triocytlammonium bromide (TOAB, 98%), anhydrous toluene (99.8%), anhydrous ethanol (≥99.5% denatured), anhydrous chloroform stabilized by pentenes (99%) and benchtop chloroform (ACS grade) were purchased from Sigma-Aldrich (St. Louis, Mo.). Trioctylamine (>99.0%) and dodecene (>98%) was purchased from Fluka Analytical (St. Louis, Mo.).

Jeffamine M-1000 was provided by Huntsman Petrochemical Corporation, Woodlands, Tex.

Nitric acid (99.9%) and hydrochloric acid (99.9%) were purchased from Fisher Scientific (Waltham, Mass.).

Trisilane (99.99%) was purchased from Voltaix, LLC (North Branch, N.J.) and should be used with caution as it is a pyrophoric liquid with high vapor pressure.

All chemical were used as received except for squalane, which was further purified by three freeze-pump-thaw cycles under reduced pressure (400 mTorr). Triply distilled deionized water (DI-$H_2O$) filtered with an 18.2 MΩ-cm resistance Barnstead E-pure unit was used for all aqueous preparations.

Materials Characterization

The following methods were utilized for characterizing the materials utilized in the examples described herein.

Transmission electron microscope (TEM) images were acquired from nanowires deposited over a vacuum background on lacey carbon TEM grids using a JEOL 201F field-emission TEM operating at 200 kV. TEM was performed on a Tecnai G2 Sprit BioTWIN operating at 100 kV. High resolution TEM (HRTEM) images were obtained with a JEOL 2010F equipped with a field emission gun operated at 200 kV. The JEOL 2010F HRTEM is equipped with an Oxford Inca energy dispersive X-ray spectrometer (EDS) and high angle annular dark field detector (HAADF), which was used to obtain EDS composition line profiles radially along the diameter of the nanowires. TEM samples were prepared by drop-casting dilute dispersions of nanowires suspended in chloroform onto 200 mesh lacy carbon copper grids (Electron Microscopy Sciences). EDS measurements were taken of wires suspended over vacuum to minimize background signal. Scanning electron microscopy (SEM) imaging was performed using a Zeiss SUPRA™ 40 VP SEM at a working voltage of 2 kV and working distance of 3-6 mm. SEM samples were prepared by depositing Si nanowires onto Si substrates with native oxide.

SEM was performed using a Zeiss SUPRA™ 40 SEM operating at 5 keV with a working distance of 5 mm.

Ultraviolet-visible-near infrared (UV-vis-NIR) optical absorbance spectra were obtained at room temperature using a Varian CARY™ 500 UV-Vis spectrophotometer in transmission mode. Composite samples were mounted over a 15×18 mm aperture, and the absorption coefficient was calculated from the thickness of the polymer film (100 µm) or the path length of the cuvette (1 cm) and the volume percent of Ge in the sample. For PEGylated Ge nanowires in DMSO, dilute dispersions were prepared to ensure the absorbance value was less than 1.0, with a concentration of 25 µg/mL. The nanowires were dispersed in KAPTON™ polyimide film (available commercially from E.I. DuPont de Nemours & Co., Wilmington, Del.) with a weight fraction of 0.7%. The Ge density of 5.323 g/$cm^3$ was used to convert these values to volume fraction of nanowires in the suspending medium.

X-ray diffraction (XRD) was performed with a Bruker Nonius D8 Advance powder diffractometer using Cu Kα radiation (λ=1.54 Å). Nanowires were deposited onto quartz substrates and scanned for 3-4 h with a scan rate of 12°/min at 0.02° increments with a simultaneous sample rotation of 15°/min.

X-ray photoelectron spectroscopy (XPS) was conducted with a Kratos photoelectron spectrometer equipped with a charge neutralizer and 180° hemispherical electron energy analyzer. Al K-α was the X-ray radiation source. The X-ray takeoff angle was 68° and the spot size was 200 µm. Samples were prepared by depositing wires onto indium tin oxide coated glass (Delta Technologies). All spectra were calibrated to the hydrocarbon peak at 284.5 eV. A tungsten charge neutralizer coil operated at 2.8 V was used to compensate for sample charging.

Attenuated Total Reflectance Fourier transform Infrared spectroscopy (ATR-FTIR) was performed using a Thermo Mattson Infinity Gold FTIR. Background scans were first taken of a clean ATR stage. Just prior to measurement, nanowires were ground in a mortar and pestle and then deposited on the ATR crystal from a solution of chloroform. Before each scan, the sample chamber was purged with nitrogen for 15 min to remove any traces of water, $CO_2$, or chloroform.

Mass spectrometry was carried out on a TSQ quantum (Thermo scientific). Liquid samples were prepared in gas chromatography vials. Analysis was performed under chemical ionization with methane gas.

Commonly used mechanical tests, such as the bend tests used in atomic force microscopes (AFM)[35, 36, 37, 38] and the tests of nanowire cantilevers under electric field-induced resonance,[39, 40] work well for examining the elastic properties of some nanowires, but are difficult to use for determining properties such as the limit of flexibility and bending strength. Therefore, robotic nano-manipulation was utilized in an SEM to test individual nanowires under high flexural strain with simultaneous imaging to determine the maximum strain and fracture strengths of the nanowires.[41] The procedure and results are described in some of the following examples (see, e.g., EXAMPLE 5).

EXAMPLE 1

This example illustrates one particular, non-limiting embodiment of a method for synthesizing Ge nanowires of the type used in the examples herein.

Ge nanowires were synthesized by the supercritical fluid-liquid-solid (SFLS) method using diphenylgermane as a precursor and colloidal gold (Au) nanocrystals as seeds.[42, 43] Dodecanethiol-capped Au nanocrystals were prepared by the Brust method,[44] using hydrogen tetrachloroaurate (III) trihydrate dissolved in deionized water, tetraoctylammonium bromide dissolved in toluene, and sodium borohydride as a reducing agent. For Ge nanowire growth, a solution of 35 mM diphenylgermane and 16 mg/L dodecanethiol-capped 2 nm diameter Au nanocrystals in anhydrous benzene was prepared in a nitrogen-filled glovebox and injected into a 10 mL titanium reactor at 380° C. and 6.3 MPa at a flow rate of 0.5 mL/min. Nanowire growth was carried out for 40 min, resulting in approximately 20 mg of nanowires. After the growth step, the sealed reactor was cooled to a lower temperature for surface passivation.

EXAMPLE 2

This example illustrates one particular, non-limiting embodiment of Ge nanowire surface passivation in accordance with the teachings herein.

Ge nanowires were passivated in the reactor by the addition of either 1-dodecene or 11-mercaptoundecanoic acid. The nanowires passivated with mercaptoundecanoic acid were further PEGylated (that is, reacted with polyethylene glycol to produce functionalized nanowires) after removal from the reactor. In this case, the thiol bonds to the Ge surface to provide an organic monolayer with exposed carboxyl functional groups available to dock the PEG-amine molecules. This procedure ultimately results in mercaptoundecanoic-amide-polyethyleneglycol functionalized Ge nanowires.[45]

Dodecene passivation was carried out by cooling the reactor to 220° C., injecting a 10 mL benzene solution with 33 vol % 1-dodecene, and incubating for 2 hours.[46] The reactor was then cooled to room temperature and the nanowires were extracted from the reactor with toluene.

Mercaptoundecanoic acid passivation was carried out by cooling the reactor to 80° C. and then injecting 10 mL of 10 vol % 11-mercaptoundecanoic acid in anhydrous benzene.[47] After 2 hours, the reactor was cooling to room temperature and the nanowires were extracted, washed, and redispersed in dimethylsulfoxide (DMSO), as described elsewhere.[48]

EXAMPLE 3

This example illustrates one particular, non-limiting embodiment of the PEGylation of the mercaptoundecanoic acid passivated nanowires produced in EXAMPLE 2.

PEGylation of the mercaptoundecanoic acid passivated nanowires was achieved by coupling the terminal carboxylic acid groups with the amine terminus of 1000 molecular weight poly(oxyethylene)-poly(oxypropylene) amine polymer (JEFFAMINE™ M-1000), forming an amide bond.[49] This procedure was carried out using carbodiimide coupling chemistry involving N-(3-dimethylaminopropyl)-N'-ethyl-carbodiimide hydrochloride (EDC hydrochloride) and N-hydroxysuccinamide (NHS). Details of the synthesis can be found in Reference 20. Again, the resulting nanowires were precipitated, washed, and redispersed in DMSO.[50]

EXAMPLE 4

This example illustrates one particular, non-limiting embodiment of the manufacture of a film construct in accordance with the teachings herein.

The dodecene-passivated Ge nanowires produced in EXAMPLE 3 were dispersed in Kraton SBS triblock copolymer (D1102K) films by mixing nanowires with the polymer in toluene at the desired ratios. After 5 minutes of sonication, the nanowire/polymer solution was deposited into a 4 cm diameter stainless steel mold. The solvent was allowed to evaporate overnight and then placed in a vacuum oven (Fisher ISOTEMP™ 281A) at a pressure of 730 Torr at room temperature for one hour. The nanowire/polymer films were approximately 100 μm thick.

As illustrated in EXAMPLE 4 above, various bulk constructs may be made in accordance with the teachings herein which feature nanowires of Group IV materials (and preferably nanowires of semiconductor Group IV materials) which are embedded or disposed in a polymer matrix. For example, homogeneous blends of Ge nanowires may be embedded in an elastomeric resin, such as the styrenic block copolymers consisting of polystyrene blocks and rubber blocks which are sold under the tradename KRATON™. The preparation of such constructs may be facilitated by hydrophobic organic monolayer passivation of the nanowires, and stable dispersions of the nanowires in a solvent may be achieved, by grafting a suitable monomer or polymer, such as polyethylene glycol (PEG), onto the Ge nanowires.

It is found that the resulting nanowires exhibit enhanced light absorption compared to bulk Ge near the band edge, with a linear dependence on photon energy. An absorbance peak is also observed at about 600 nm, resulting from enhanced light-trapping due to the high index of refraction of Ge at this wavelength. Discrete dipole approximation (DDA) calculations reveal that the light trapping within the nanowires depends also on the nanowire size and incident light polarization. These optical effects are useful for applications requiring low reflectivity and strong light absorption, such as the use of the bulk constructs described herein in photovoltaic applications and as anti-reflective materials.

Figure 20:
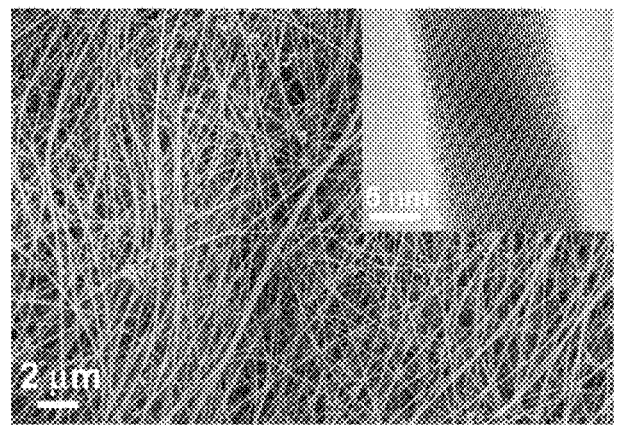
FIG. 20 is an SEM image (with a TEM image inset) of Ge nanowires made in accordance with the teachings herein.

FIG. 20 shows SEM and TEM images of Ge nanowires which may be used to create such embedded constructs. The nanowires are single crystals with average diameter and length of approximately 30±15 nm and 50 μm, respectively. Optical measurements were performed on these nanowires by dispersing them in a solvent or in a transparent polymer host.

Figure 21:
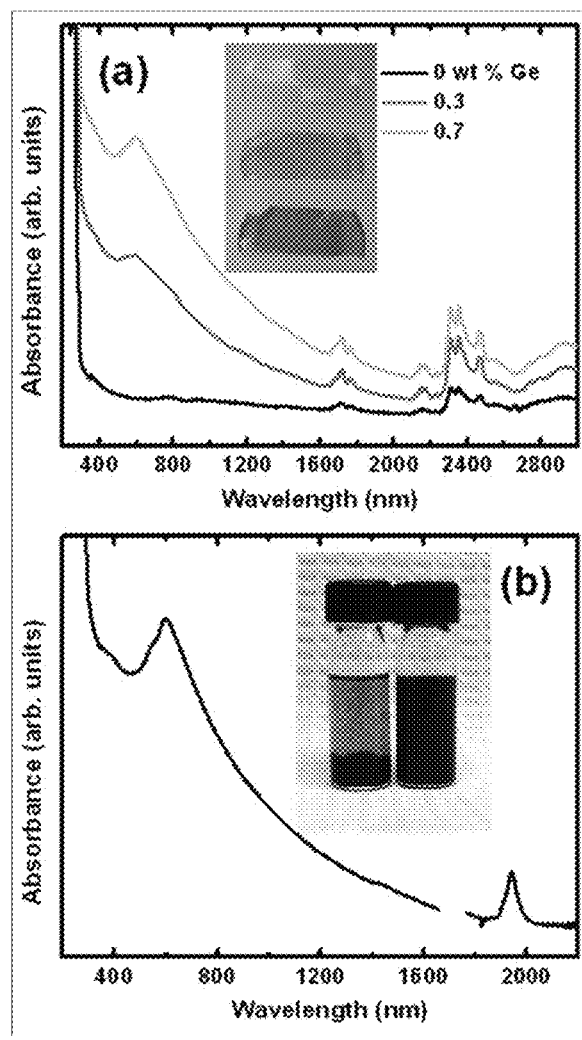
FIG. 21 is a room temperature absorbance spectra of (a) 100 µm thick Kraton and Kraton-Ge nanowire composites with two different Ge nanowire loadings and (b) PEGylated Ge nanowires dispersed in DMSO (25 µg/mL). Inset in (a): photographs of the Kraton-Ge nanowire composites; inset in (b): photograph of concentrated dispersions of mercaptoundecanoic acid-treated Ge nanowires in DMSO (left) before and (right) after PEGylation. The absorbance values recorded were all below 1.0.
Figure 22:
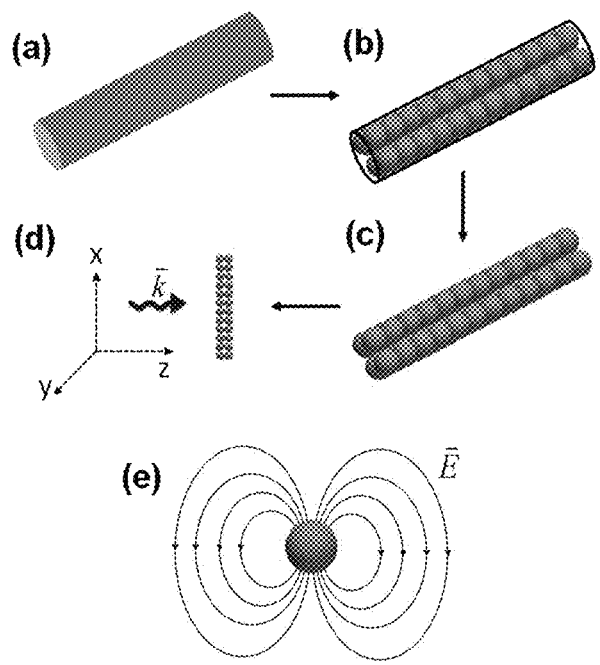
FIG. 22 shows a DDA model employed to calculate the optical absorption of a Ge nanowire. The nanowire illustrated in (a) is modeled as an array of dipoles with a 2×2 dipole cross section, as shown in (b) and (c). For the calculations, the incident light is applied to the collection of dipoles with a specific polarization, as shown in (d). Each dipole emanates an electric field, as shown in (e), and the total electric field at a particular dipole is the sum of the incident electric field and the field from all other dipoles in the nanowire.

Solvent dispersions were made using PEGylated nanowires in DMSO. The PEG-coated nanowires formed very stable dispersions in DMSO, as shown in FIG. 21. There is a distinct difference in dispersibility between the carboxy-functionalized nanowires and those with the PEG coating. The PEGylated Ge nanowires remain dispersed in DMSO for days without observable settling. Dodecene-treated nanowires were less stable than the PEGylated nanowires when dispersed in solvents, but could be dispersed very well in the KRATON™ polymer. The combination of their hydrophobic surface passivation along with the high viscosity of the polymer solutions facilitated the formation of polymer films that were well-dispersed with nanowires. It was found that the nanowire loading could be varied systematically depending on the loading of the polymer solution, as shown in the photograph in FIG. 21. Weight fractions of up to 1% nanowires could be made without observable nanowire aggregation.

FIG. 21 shows room temperature UV-vis-NIR absorbance spectra of (a) KRATON™ films loaded with 0.3 and 0.7 wt % dodecene-treated nanowires and (b) PEGylated nanowires dispersed in DMSO. The break in the curve between wavelengths of 1660 and 1770 nm in FIG. 21b is attributable to the very strong optical absorption of DMSO in that region and the peak at 1950 nm is from PEG. The series of peaks in FIG. 21a beyond 1600 nm correspond to absorbance from the KRATON™ polymer. Apart from those features associated with the solvent and polymer, the absorbance spectra of the nanowires dispersed in either DMSO or KRATON™ films have a qualitatively similar appearance, indicating that the host matrix is not significantly affecting the measured optical response of the nanowires. Each sample exhibited an absorption edge at about 1850 nm, which corresponds to the optical gap of Ge of 0.67 eV. There is also an absorption peak near 600 nm, along with a weak shoulder at slightly higher energy. This absorption peak corresponds to a maximum in the index of refraction for Ge, indicating that this peak is related to light-trapping within the nanowires.

Both the polymer- and solution-dispersed samples exhibit noticeable differences in their optical absorption compared to bulk Ge. Using a discrete dipole approximation (DDA) model, the origin of these features was explored by calculating the expected light scattering and optical absorption from a Ge nanowire. DDA calculations have been used to estimate the optical absorption and scattering from nanoparticles with arbitrary shape and structure, like core-shell particles, rods, or ensembles, and interstellar dust grains.[51]

The calculations were performed by approximating the object as an array of point dipoles. This is reasonable, provided that the spacing between dipoles is small compared to the wavelength of light.[52, 53] The volume of the object is represented by a collection of dipoles with complex polarizability $\tilde{\alpha}_j$, arranged on a cubic grid at positions $\vec{r}_j$. Each dipole has a polarization of $$\vec{P}_j = \tilde{\alpha}_j \vec{E}_{loc,j} \qquad \text{(EQUATION 3)}$$

$\vec{E}_{loc,j}$ is the local electric field at point $\vec{r}_j$, which arises from both the incident electric field $\vec{E}_{inc,j}$, and the electric field arising from the other dipoles in the system, $\vec{E}_{dipole,j}$:

$$\vec{E}_{dipole,j} = -\Sigma_{k \neq j} \tilde{A}_{jk} \vec{P}_k \qquad \text{(EQUATION 4)}$$

In EQUATION 4, $$\tilde{A}_{jk} = \frac{e^{i\kappa r_{jk}}}{r_{jk}} \left[ \kappa^2 (\hat{r}_{jk}\hat{r}_{jk} - \tilde{1}_3) + \frac{i\kappa r_{jk}-1}{r_{jk}^2}(3\hat{r}_{jk}\hat{r}_{jk} - \tilde{1}_3) \right] \qquad \text{(EQUATION 5)}$$

K=ω/c is the wavenumber of the incident radiation, $r_{jk}$ is the separation between dipoles j and k, $\hat{r}_{jk}$ is the unit vector in the $r_{jk}$ direction, and $\tilde{1}_3$ is the 3×3 identity matrix. In a system with N dipoles, the polarizations $\vec{P}_j$, of each dipole, can be found by solving the system of 3N complex linear equations described by $$\sum_{k=1}^{N} \tilde{A}_{jk} \vec{P}_k = \vec{E}_{inc,j} \qquad \text{(EQUATION 6)}$$

where $$\tilde{A}_{jj} = \tilde{\alpha}_j^{-1} \qquad \text{(EQUATION 7)}$$

The polarizability of each dipole is related to the complex dielectric constant $\tilde{\varepsilon}_j$, of the material through the use of the Claussius-Mossotti relation $$\tilde{\alpha}_j = a^3 \frac{\tilde{\varepsilon}_j - \varepsilon_{hst}}{\tilde{\varepsilon}_j - 2\varepsilon_{hst}} \qquad \text{(EQUATION 8)}$$

where a is the dipole radius and $\varepsilon_{hst}$ is the dielectric constant of the host material. Values for the dielectric constant of Ge were taken from the CRC Handbook of Chemistry and Physics.[54] The radiative correction for the polarizability of a finite dipole established by Draine,[55, 56]

$$\tilde{\alpha}_{cor,j} = \frac{\tilde{\alpha}_j}{1 - i\frac{2\kappa^3}{3}\tilde{\alpha}_j} \qquad \text{(EQUATION 9)}$$

was also used.

Figure 3:
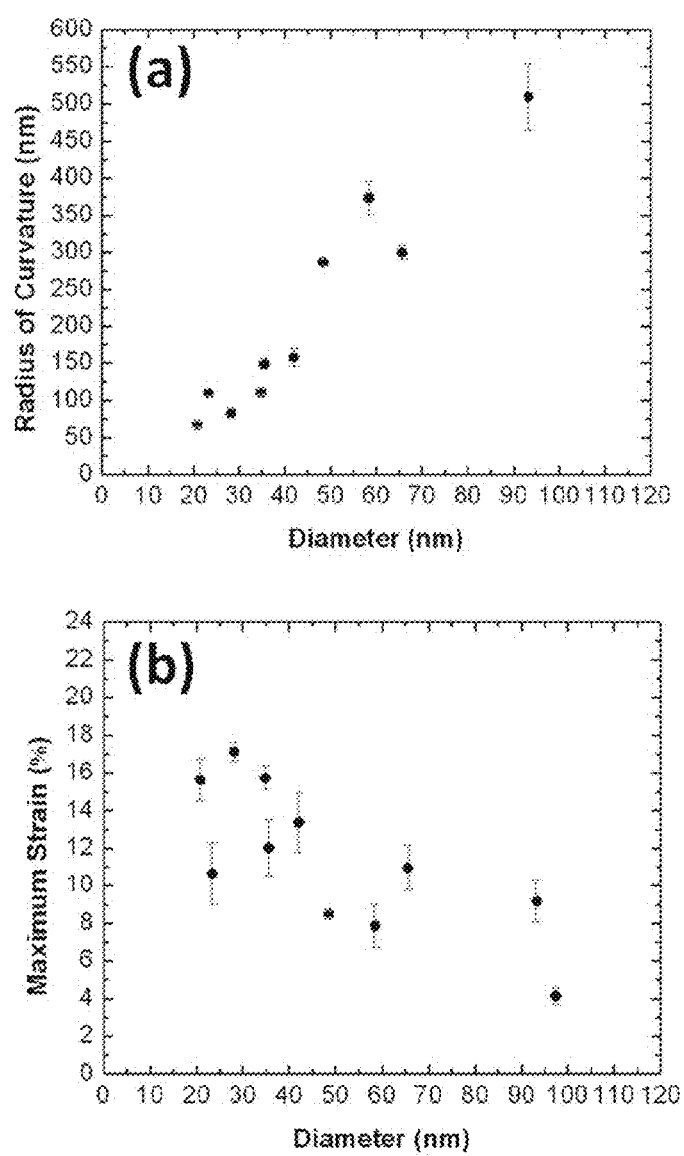
FIG. 3a is a graph depicting the maximum (a) radius of curvature measured for Ge nanowires of varying diameter (all nanowires had <111> growth directions, as determined from FFTs of HRTEM images; see FIG. 2c inset).
FIG. 3b is a graph depicting the maximum flexural strain measured for Ge nanowires of varying diameter (all nanowires had <111> growth directions, as determined from FFTs of HRTEM images; see FIG. 2c inset).

Calculations of the optical response were performed by modeling the nanowire with a 2×2 dipole cross-section, as illustrated in FIG. 3. The dipole radius and spacing was adjusted to provide the desired nanowire diameter defined as the diagonal of the 2×2 dipole cross-section:

$$D = 2a + \sqrt{2}d \qquad \text{(EQUATION 10)}$$

where a is the dipole radius and d is the spacing between dipoles on the cubic grid. A nanowire length of 2 microns was used in each calculation. Utilizing the method proposed by Podolskiy et al,[57] multipolar corrections to the depolarization factor are taken into account by defining $$\frac{a}{d} \approx 1.688. \qquad \text{(EQUATION 11)}$$

The optical extinction and absorption cross sections, $C_{ext}$ and $C_{abs}$, are then determined from the polarizations of the N dipoles in the system:

$$C_{ext} = \frac{4\pi\kappa}{|E_0|^2} \sum_{j=1}^{N} \text{Im}(\vec{E}_{inc,j}* \cdot \vec{P}_j) \qquad \text{(EQUATION 12)}$$

and $$C_{abs} = \frac{4\pi\kappa}{|E_0|^2} \sum_{j=1}^{N} \left\{ \text{Im}[\vec{P}_j \cdot (\tilde{\alpha}_j^{-1})* \vec{P}_j*] - \frac{2}{3}\kappa^3(\vec{P}_j \cdot \vec{P}_j*) \right\} \qquad \text{(EQUATION 13)}$$

The scattering cross-section is then $$C_{scat} = C_{ext} - C_{abs} \qquad \text{(EQUATION 14)}$$

The total electric field at each dipole can be acquired by using equation (1) with the calculated polarizations from equation (4).

Figure 23:
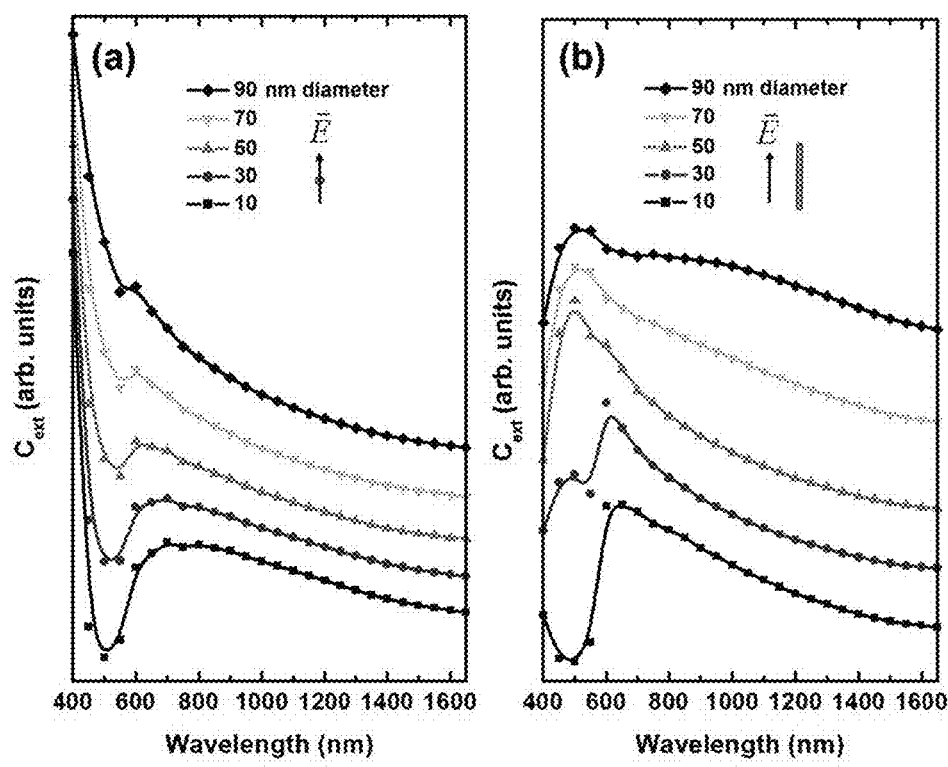
FIG. 23 shows DDA calculations of the optical extinction cross sections of Ge nanowires (2 µm in length) of varying diameter with incident light polarization set (a) perpendicular or (b) parallel to the nanowire axis. The data have been shifted vertically for clarity.

FIG. 23 shows DDA calculations of the optical extinction cross sections of Ge nanowires that are 2 μm long with varying diameter, from 10 to 90 nm. First of all, the spectra are highly sensitive to the polarization direction of the incident electric field with respect to the nanowire orientation. This is consistent with previous experimental observations of polarization anisotropy of the optical absorption and emission of semiconductor nanowires, resulting from the dramatic difference in nanowire geometry at different orientations with respect to the incident electric field, as well as the large difference in dielectric constant between the nanowire and host material.[58, 59] When the polarization is perpendicular to the length of the nanowire (FIG. 23a), there is a significant dip in optical extinction at 500 nm with a peak at about 600 nm when the nanowire diameter is smaller than about 50 nm. This dip occurs because the index of refraction fo Ge is significantly lower at 500 nm and results in less efficient light trapping and correspondingly lower absorption. Likewise, the peak at 600 nm is the consequence of the maximum in the index of refraction of Ge at that wavelength that results in the most efficient light trapping and the greatest light absorption. This peak appears only when the scattering component (and the nanowire diameter) is sufficiently small. A similar peak was observed by Cao et al. for small diameter single Ge nanowire photodetectors,[60] which they attributed to leaky-mode resonances. The drop at 500 nm becomes less pronounced as the diameter increases because the scattering becomes more intense with increasing diameter and overcomes the dip in absorbance.

The calculated absorbance peak is close to the experimentally observed peaks shown in FIG. 21. Spectra calculated with the incident electric field aligned along the length of the nanowire (FIG. 23b) exhibit more dramatic changes in the shape of the absorption spectra for nanowires of varying diameter. The change in the absorption spectra with varying diameter and wavelength occurs because the internal electric field within the nanowire is not only proportional to the incident wavelength, but also a strong function of the geometry of the object.[61] The different combinations of these parameters result in different resonant modes. Since the Ge nanowires dispersed in DMSO and Kraton have randomly distributed orientations and randomly polarized light, the calculations provide only a qualitative guide to what is observed and all of the specific details of the spectra are not expected in the experimental measurements; however, the calculations provide an estimate of the expected optical signal. The alignment of nanowires in composite films could lead to the enhancement of modes specific to a particular orientation.[62]

Figure 24:
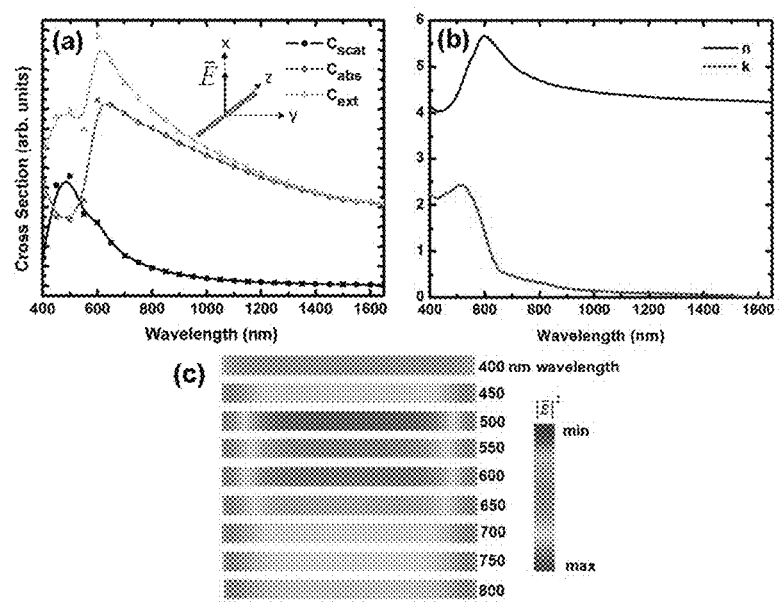
FIG. 24 shows (a) scattering, absorption, and extinction cross sections ($C_{scat}$, $C_{abs}$, $C_{ext}$, respectively) calculated for a 30 nm diameter germanium nanowire with a length of 2 µm using Equations (10)-(12). Inset: Illustration of the nanowire orientation with respect to the polarization direction of the incident field as described in the text. (b) Real (n) and imaginary (k) components of the complex index of refraction, n+ik, for Ge as a function of wavelength.[25] In (c), each bar represents a 30 nm diameter, 2 µm long nanowire illuminated with light of the stated wavelength, showing the calculated electric field intensity along the length of the nanowire.

To best approximate the situation of nanowires dispersed with random orientations, DDA calculations were performed with the model nanowire tilted at 45° from the x-, y-, and z-axis relative to the polarization direction of the incident field (applied along the x-direction as illustrated in the inset in FIG. 24a). In this configuration, the electric field vector is distributed evenly along the three dimensions of the nanowire.

FIG. 24a shows the calculated extinction spectrum for a 2 μm long, 30 nm diameter Ge nanowire, along with the absorption and scattering components. The peak at 600 nm is not due to scattering, but is associated with light absorption by the nanowires. It is clear from a comparison of the complex index of refraction, n+ik, of Ge as a function of wavelength (FIG. 24b)[63] to the absorption component of the spectrum in FIG. 24a that the light absorption within the nanowire is a strong function of n: n exhibits a local maximum at 600 nm for Ge, and since total internal reflection is a function of the ratio of the indices of refraction of the material and the surrounding media, light trapping is greatest at this wavelength. For this reason, the calculated and experimental absorption spectra both exhibit a peak at 600 nm where the light-trapping effect is the strongest. Similarly, the drop in absorbance observed at 500 nm corresponds to the decrease in index of refraction at that wavelength.

The data in FIG. 23 illustrate that this drop off in absorbance is most pronounced for nanowires with the smallest diameter. This is because the scattering cross-section of the nanowires increases with increasing diameter. The scattering component of the spectrum in FIG. 24a reaches a maximum at 500 nm and compensates for the drop in absorbance. FIG. 23 shows that the intense scattering from the larger-diameter nanowires has almost completely negated the drop off in absorbance at 500 nm, while the smaller-diameter nanowires are dominated by absorbance.

FIG. 24c displays the electric field intensity distribution calculated along the length of the nanowire with incident wavelengths varying between 400 and 800 nm. Although the model does not have the necessary resolution for a detailed determination of the internal electric field intensity within the nanowire, the field is clearly enhanced in the middle of the nanowire. The relative electric field intensities are highest in the middle of the nanowires for wavelengths between 500 and 600 nm, corresponding to the local maximum in the experimentally observed extinction spectrum. This resonant behavior observed within the interior of the nanowire is indicative of light trapping in these nanoscale elements, which is manifested as an increase in absorption at these wavelengths. Again, this finding is consistent with the work of Cao and coworkers, who have observed enhanced photoresponse from Ge nanowires.[64, 65]

Although the model calculations also give rise to a scattering peak at 500 nm, the experimental data did not have a peak at this wavelength. This shows that, while scattering does contribute to the overall spectrum, the optical properties of the nanowires in this study are dominated by enhanced absorption due to light-trapping. In addition, as the results in FIG. 23 indicate, the light scattering should be significantly affected by the nanowire orientation with respect to polarized light. The randomly oriented collection of nanowires in both the KRATON™ elastomers and DMSO samples may smear out a distinct optical feature.

Figure 25:
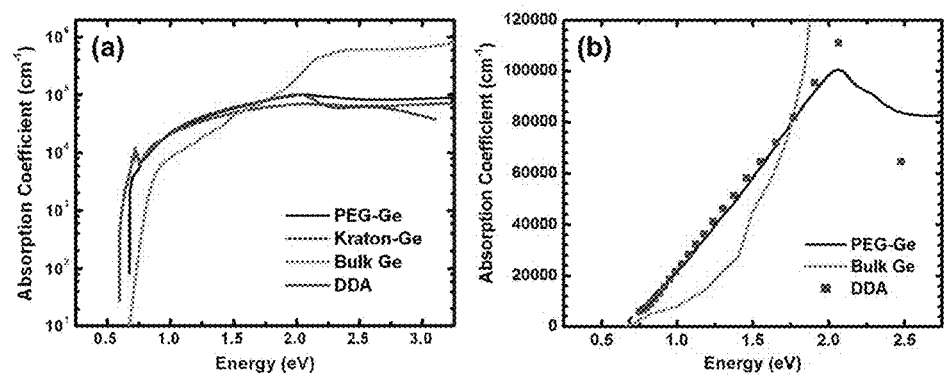
FIG. 25 shows (a) Optical absorption coefficients of bulk Ge,[8] PEGylated Ge nanowires dispersed in DMSO (25 µg/mL, or 0.00047 vol %), dodecene-treated Ge nanowires in Kraton (0.7 wt %, 100 µm thick), and normalized DDA calculation for a 30 nm diameter nanowire 2 µm in length, with incident light polarization vectors oriented equally along each axis. (b) Bulk optical absorption coefficients, PEGylated Ge nanowire absorption coefficients, and DDA calculation shown on a linear scale.

FIG. 25a shows the extinction spectra calculated using the DDA model for a 30 nm diameter Ge nanowire (2 μm long, oriented at 45° from the x-, y-, z-axis with linear polarized light applied with an x-oriented electric field). Also included on the same plot are the known values for bulk Ge and the experimentally measured spectra of nanowires dispersed in Kraton and DMSO. The optical gap of the Ge nanowires is consistent with bulk Ge at 0.67 eV. The small deviation for the polymer/nanowire film at energies just below the Ge band gap is due to the absorption of the Kraton polymer.

The nanowires exhibit a band gap energy similar to bulk Ge. However, despite the similar band gap, there is a very significant difference in the energy-dependence of the absorption coefficient of the Ge nanowires and bulk Ge near the band edge at 0.67 eV. The nanowires exhibit a significantly enhanced absorption coefficient for photon energies below about 1.5 eV. As illustrated in FIG. 25b, the wavelength-dependence of the absorption coefficient of the nanowires is linear, which is different than what is expected for either a direct or indirect semiconductor. The DDA model calculations showed a similar energy-dependence of the absorption coefficient as the experimental measurements and therefore, we attribute the enhanced absorption to the light trapping effect elucidated by the DDA calculations.

In addition to the enhanced absorption of individual nanowires, the collective light scattering effects from an ensemble of nanowires can lead to increased absorbance. The random arrangement causes a lengthening of the path of light rays in the material, increasing the interaction with nanowires and further increasing absorption.[66, 67, 68, 69] Therefore, while the model captures the essence of the observed optical absorption data, including enhanced absorption and light trapping, the model does not account for the fact that the nanowire dispersions consist of many nanowires with random orientations and that there may also be collective behavior or multiple scattering effects. Of course, one skilled in the art will appreciate that other models may be utilized which entail a more elaborate description of collections of nanowires with appropriate distributions of nanowire sizes.

It will be appreciated from the foregoing that Ge nanowires dispersed in polymer and in a solvent may be used to measure the optical properties of Ge nanowires, and that the absorbance spectra of the nanowires may be markedly different from bulk Ge. The absorbance spectra calculated using the DDA showed that the extinction spectra depend significantly on the dimensions of the nanowires and their relative orientation with respect to the incident electric field polarization, and displayed qualitative agreement with the experimentally measured spectra. The absorption peak at 600 nm and the anomalous wavelength-dependence of the extinction spectra near the absorption edge arise from enhanced light trapping due to the nanowire geometry and the local maximum in the index of refraction of Ge near 600 nm. The observed spectra are consistent with other recent studies of Ge nanowire optical response.[70, 71] The extinction spectra for small-diameter nanowires are dominated by light trapping, while large-diameter nanowires exhibit a significant scattering component. The results demonstrate the potential to engineer the absorption and light trapping behavior of semiconductor nanowire films and other constructs by tuning optical interactions based on their size, shape and orientation.

EXAMPLE 5

This example illustrates one particular, non-limiting embodiment of a method for conducting strain tests on nanowires produced in accordance with the teachings herein.

Figure 2:
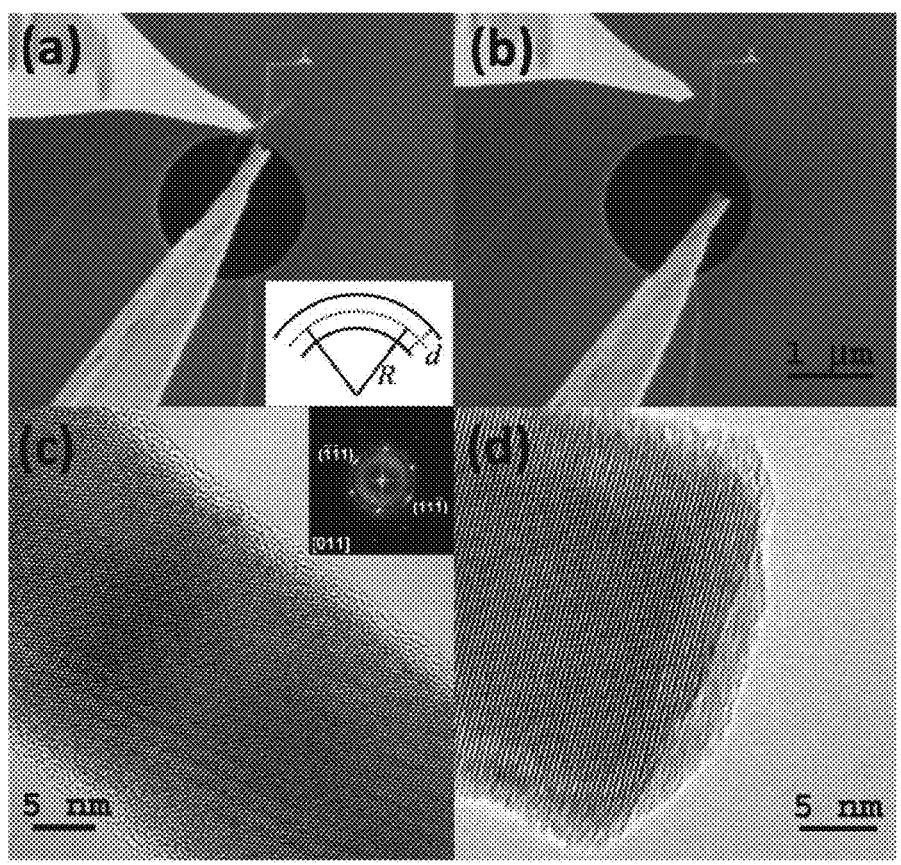
FIG. 2a is a pre-fracture SEM of a Ge nanowire being manipulated with two STM probes (the inset is a schematic of a bent nanowire).
FIG. 2b is a post-fracture SEM of a Ge nanowire being manipulated with two STM probes.
FIG. 2c is a TEM of a manipulated Ge nanowire obtained from the fractured Ge nanowire acquired near the substrate (the inset is an FFT of the image).
FIG. 2d is a TEM of a manipulated Ge nanowire obtained from the fractured Ge nanowire acquired at the fractured surface.

Ge nanowires were synthesized by the gold nanocrystal-seeded SFLS process with surface passivation by exposure to isoprene, following previously reported procedures.[72, 73, 74] FIG. 1 shows TEM and SEM images of the nanowires used in the study. The nanowires investigated had diameters ranging from 23 nm to 97 nm, with crystalline diamond cubic Ge cores. For mechanical testing, Ge nanowires were drop-cast from a chloroform dispersion onto TEM grids coated with a DuraSiN™ silicon nitride membrane (obtained commercially from Electron Microscopy Sciences, Hatfield, Pa.) arrayed with 2 μm diameter holes. An individual nanowire spanning a hole in the membrane was then located in the SEM. One of the nanomanipulator probes (an electrochemically-sharpened tungsten probe) was then used to break the suspended nanowire on one end, close to the membrane. Using two tungsten probes, the nanowire was then bent parallel to the focal plane to determine the bending radius. FIG. 2 shows an example of a typical manipulation of a Ge nanowire.

The flexural strain of the nanowires investigated in EXAMPLE 5 was then determined from the radius of curvature R, resolved from captured video images. The strain $\varepsilon_x$, at a distance x from the neutral axis, is related to R as $\varepsilon_x = x/R$, and the maximum flexural strain at the point of fracture $\varepsilon_{max,T}$ occurs at the nanowire surface on the outside of the bend (illustrated in the inset in FIG. 2a). Hence, $\varepsilon_{max,T}$ relates to the nanowire diameter d, and the radius of curvature R:

$$\varepsilon_{max,T} = \frac{d}{2R} \quad \text{(EQUATION 1)}$$

The stress $\sigma_x$, in the nanowire at a distance x from the neutral axis, is proportional to the strain, $\sigma_x = E\varepsilon_x$, where E is the Young's modulus. Bending leads to simultaneous tensile and compressive stresses; however, compressive strengths of ceramic materials are typically 10 to 15 times larger than tensile strengths,[75] and hence the surface undergoing tensile strain is typically the point of failure. Therefore, the maximum tensile stress at fracture corresponds to the bending strength $\sigma_{bs}$:

$$\sigma_{bs} = E\varepsilon_{max,T} = E\frac{d}{2R} \quad \text{(EQUATION 2)}$$

The maximum radius of curvature and flexural strain prior to fracture was measured for nanowires with <111> growth direction with diameters ranging from 23 to 97 nm. The measurements were conducted at strain rates typical for quasi-static strength tests, of approximately $10^{-3}$ s$^{-1}$. FIG. 3 shows the maximum radius of curvature and corresponding flexural strain for the nanowires. The flexural strain increased systematically with decreasing nanowire diameter, from 4% to 17%, and the maximum strain observed in the nanowires was much greater than the 0.04 to 0.06% measured for bulk Ge.[5]

Figure 4:
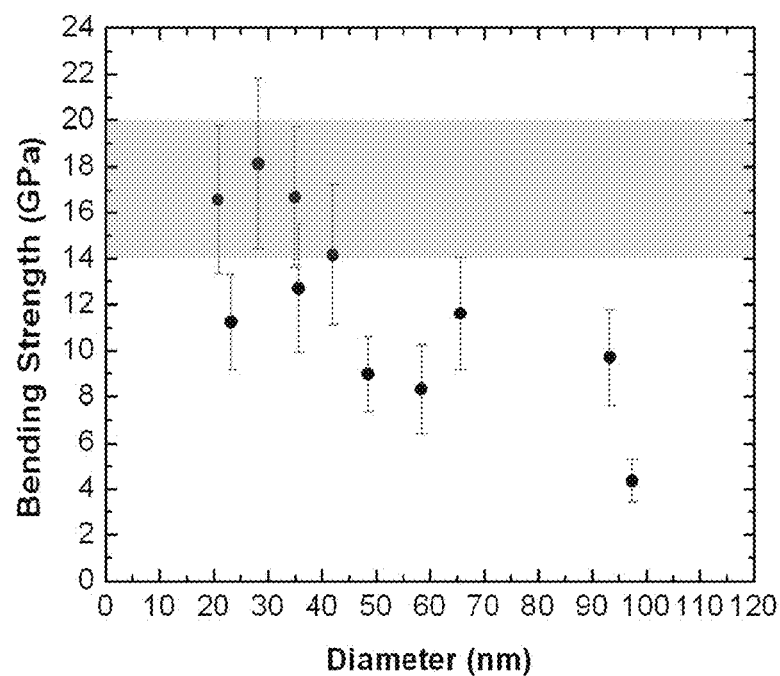
FIG. 4 is a graph depicting the bending strength measured for Ge nanowires of varying diameter; the gray shaded region corresponds to the predicted fracture strength for a perfect Ge crystal.[6, 7]

The trend of increasing bending strength with decreasing diameter is evident. Taking E=106±19 GPa, as previously measured for SFLS-grown Ge nanowires,[76] bending strengths estimated using EQUATION 2 ranged from 4±1 GPa for the largest diameter nanowire to up to 18±4 GPa for the smallest diameters. The bending strengths of the nanowires in this size range fall in the range of the approximate maximum strength of a perfect crystalline solid of E/2π (shaded region in FIG. 4),[77] and the ideal strength of 14 GPa (tensile load) predicted by Roundy and Cohen[78] for a perfect Ge crystal. The bending strength is two to three orders of magnitude greater than bulk Ge. Similar results of size-dependent fracture strengths have also been observed for Si nanowires.[79, 80, 81] The increase in flexibility and strength with decreased diameter follows from the absence of extended defects in these crystals.[82]

Figure 5:
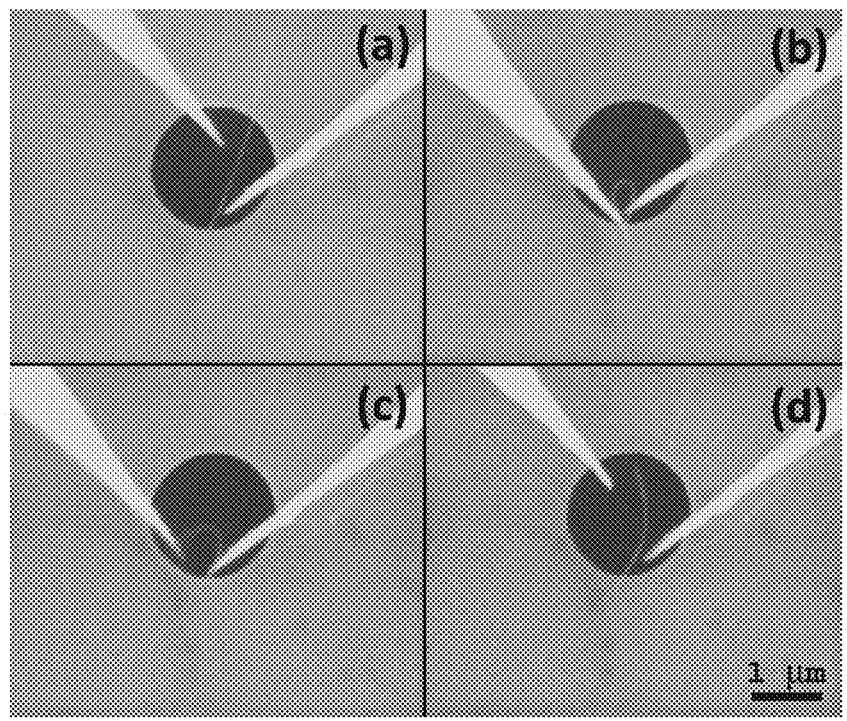
FIG. 5a is an SEM image of a Ge nanowire being manipulated with two STM probes, and showing the nanowires before being cut by one of the probes and bent to a high strain position.
FIG. 5b is an SEM image of a Ge nanowire being manipulated with two STM probes, and showing the nanowires after being cut by one of the probes and bent to a high strain position.
FIG. 5c is an SEM image of the Ge nanowires of FIG. 5b after the nanowires has been released by the probe.
FIG. 5d is an SEM image showing the plastic deformation of the Ge nanowire of FIG. 5c.
Figure 6:
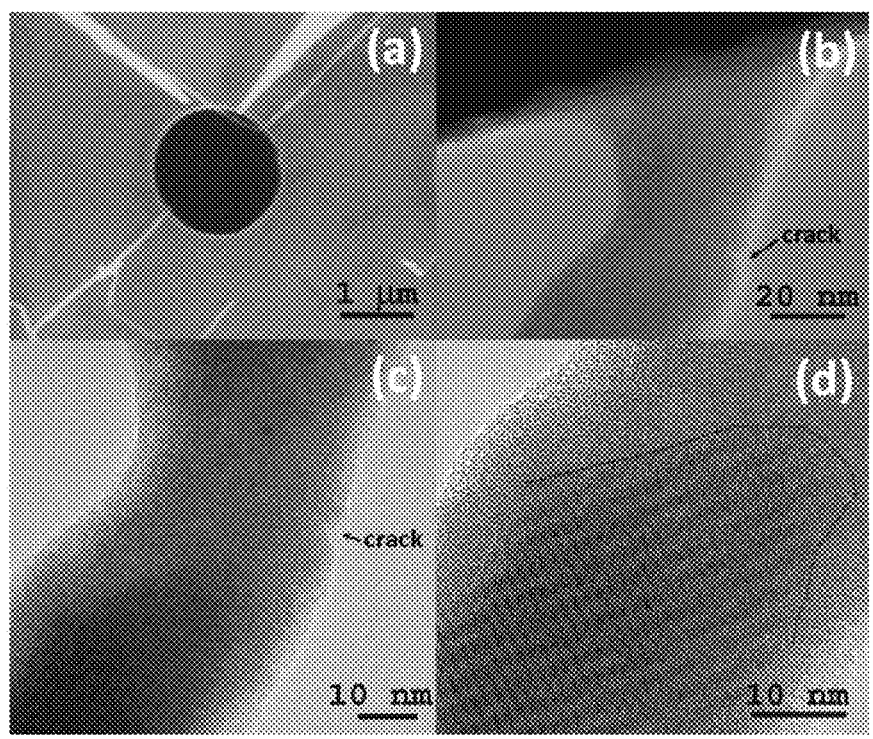

Ge nanowires bent to a position of very high strain and released prior to fracture, were found to exhibit plastic deformation (see FIG. 5). When a nanowire was released, it snapped back quickly, but retained some of its bend (FIG. 5d). The crystal structure of the nanowire at the position of the bend was examined by TEM to determine the mechanism involved in plastic deformation of the nanowires.

FIG. 5 shows TEM images of such bent nanowires. At the point of maximum compressive and tensile strain, the nanowire has become amorphous. This observation of amorphization prior to fracture is consistent with the layer of amorphous material that was also observed on fractured surfaces, as in FIG. 2d.

At the onset of fracture, crack initiation appeared to occur in the amorphous region of the nanowire at the outer strained surface. Experimental and computational studies have shown a transition from crystalline to amorphous structure in strained Si nanowires through an increase in disorder brought about by a large increase in the population of dislocations.[83, 84] Indentation studies of crystalline Ge have also shown sudden phase transformations to amorphous Ge (a-Ge) at high loads;[85] this transformation may occur by the formation of a high-pressure metallic phase followed by quenching to a-Ge as the pressure is released.

EXAMPLE 6

This example illustrates one particular, non-limiting embodiment of the preparation of a fabric from Ge nanowires in accordance with the teachings herein.

Figure 7:
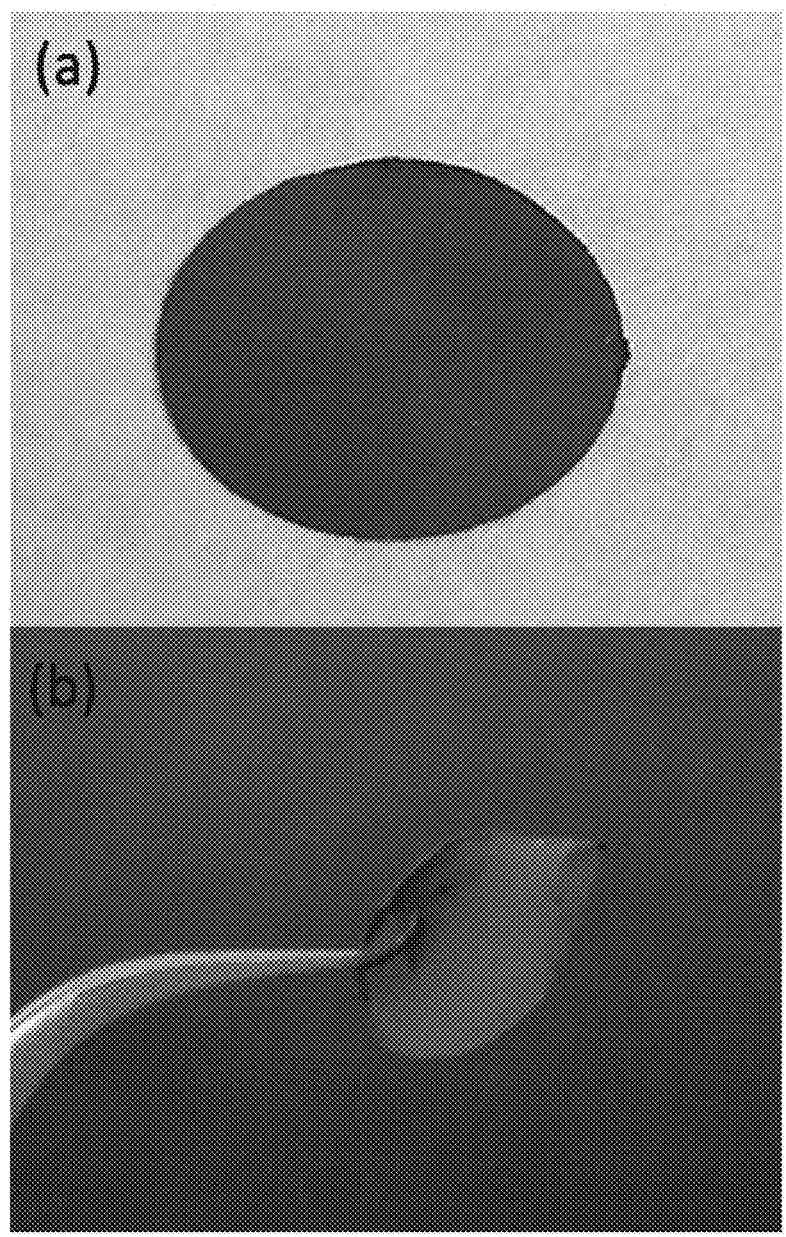
FIG. 7a is a picture of a Ge Nanowire fabric drying on an alumina membrane filter.
FIG. 7b is a picture of the Ge nanowire fabric of FIG. 7a after removal from the filter (the nanowire fabric is about 13 mm in diameter).
Figure 8:
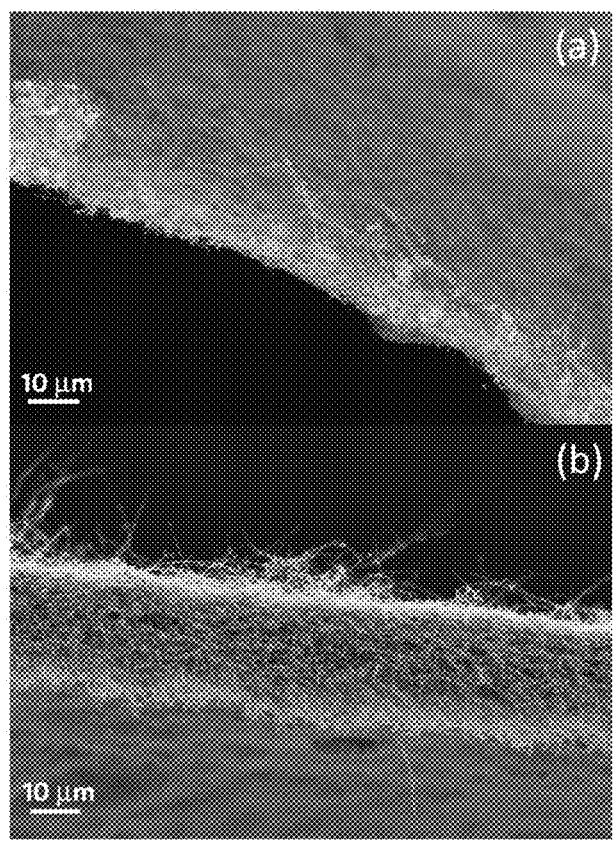
FIG. 8a is an SEM image of the edge of a thin Ge nanowire fabric.
FIG. 8b is an SEM image of the edge of a thick Ge nanowire fabric.

The large quantity of Ge nanowires produced by the SFLS method and their high flexibility allows for the fabrication of a nonwoven ceramic fabric, or paper, of Ge nanowires. FIGS. 7 and 8 show photographs and SEM images of one particular, non-limiting embodiment of such a Ge nanowire fabric. The fabric depicted was made by vacuum-filtering a dilute dispersion of nanowires in chloroform (~0.1 mg/mL) through porous alumina filters (Whatman ANODISC™ 13, 0.2 μm pores), which are then air dried for 1 hour and peeled from the filter. The thickness of the fabric can be varied by changing the nanowire loading on the filter. For instance, 7.5 μm thick fabric (FIG. 8*a*) required approximately 0.5 mg of nanowires and 25 μm thick paper (FIG. 8*b*) used approximately 1.25 mg. Based on the mass and dimensions of the nanowire paper, the density is approximately 10% of the density of bulk Ge, containing roughly 10% Ge nanowires and 90% void space by volume.

Figure 9:
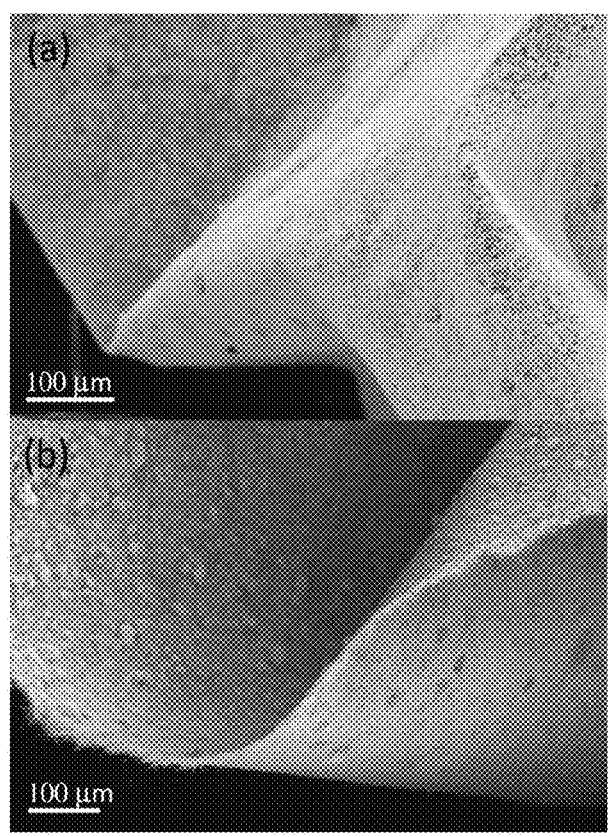
FIG. 9a is an SEM image of a section of a Ge nanowire paper made in accordance with the teachings herein.
FIG. 9b is an SEM image of a section of a Ge nanowire paper made in accordance with the teachings herein.
Figure 10:
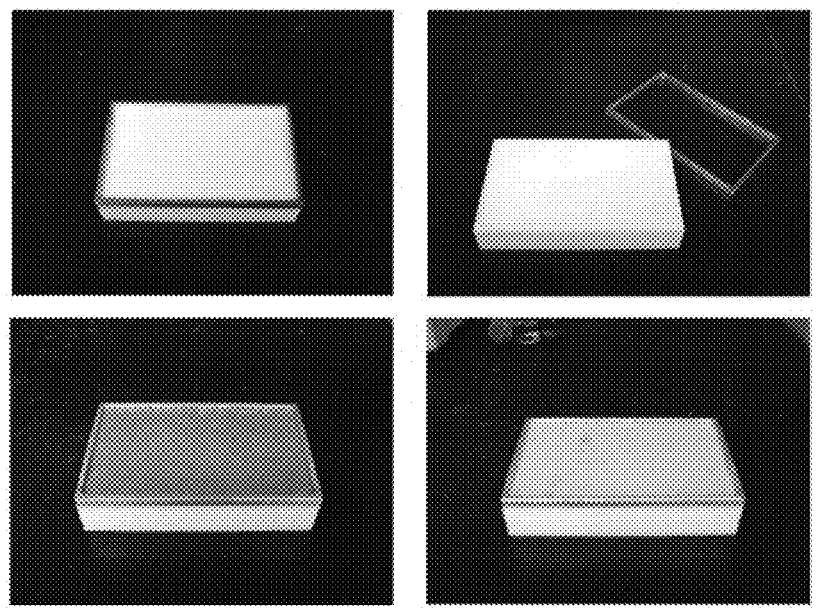
FIGS. 10-11 are images of a process for using a trough design to make a nanowire fabric or "scroll" in accordance with the teachings herein.
Figure 11:
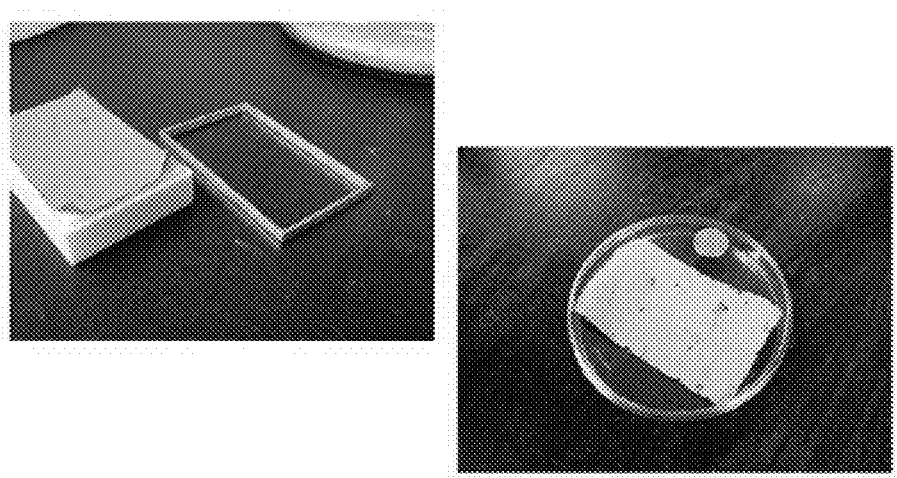
Figure 12:
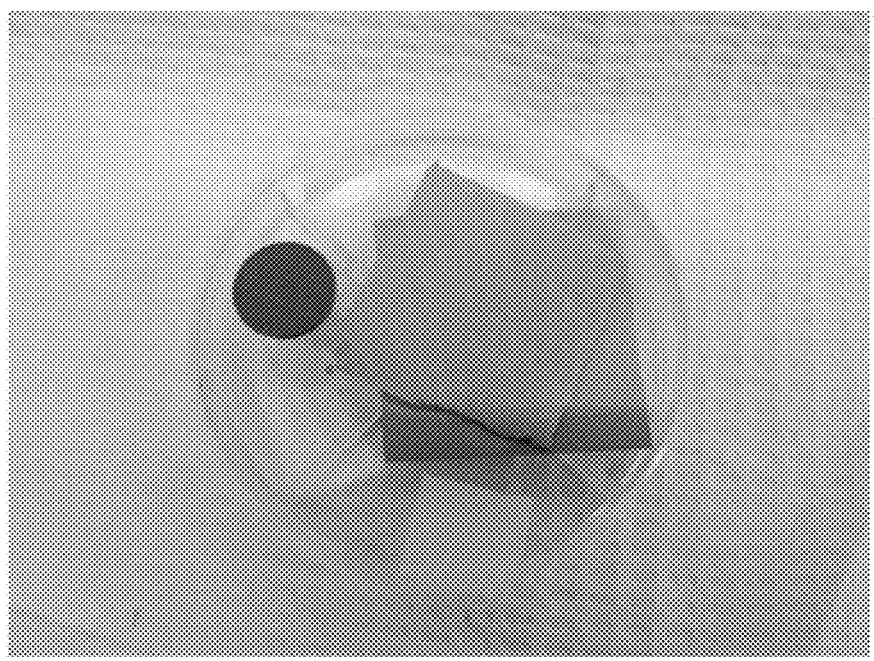
FIG. 12 is an image of a nanowire fabric made in accordance with the teachings herein and shown after being removed from a release liner on which it was formed.
Figure 13:
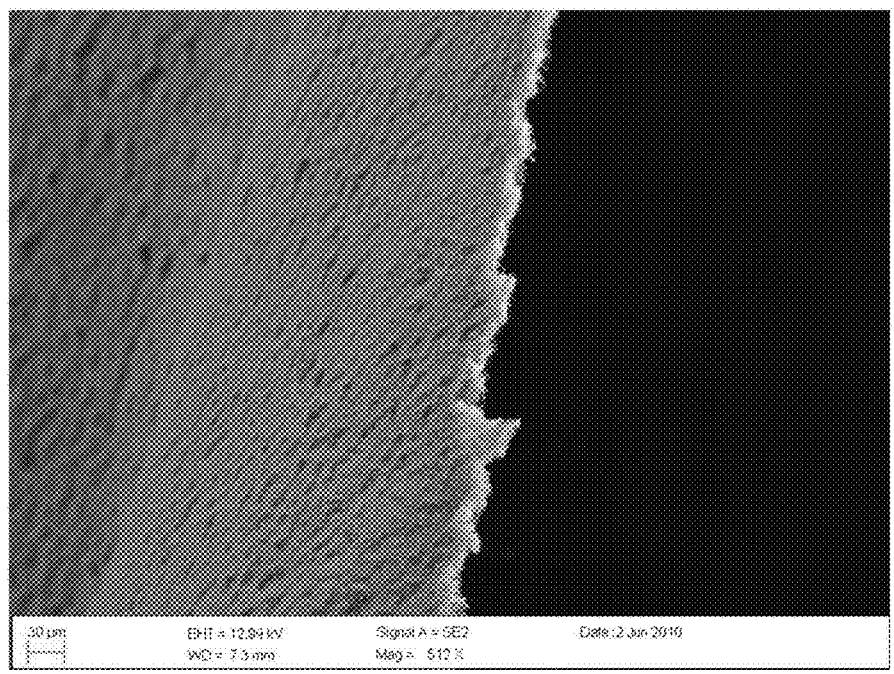
FIGS. 13-15 are SEM images of fabrics comprising Ge nanowires which have been grafted with polyethylene glycol (PEG).
Figure 14:
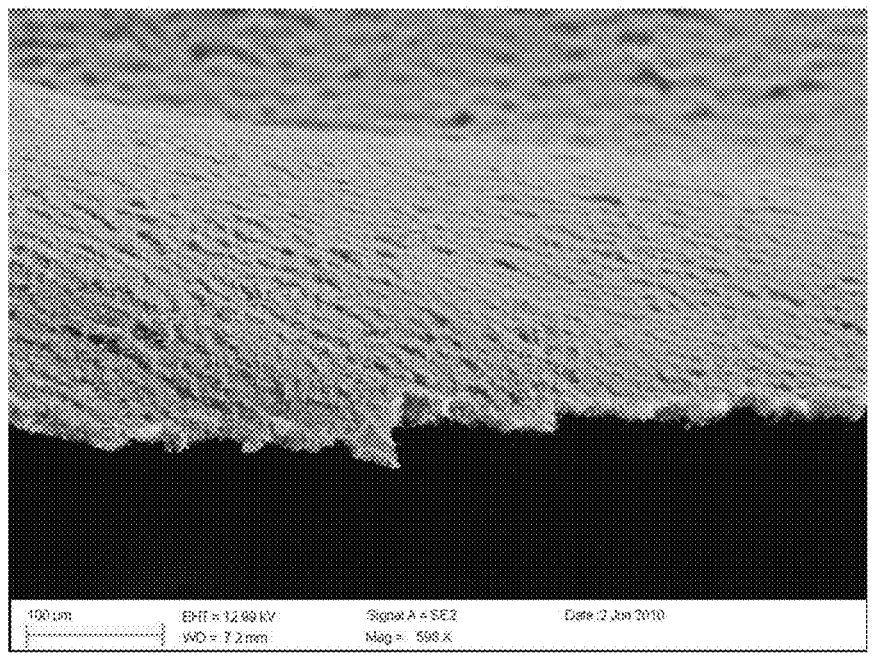
Figure 15:
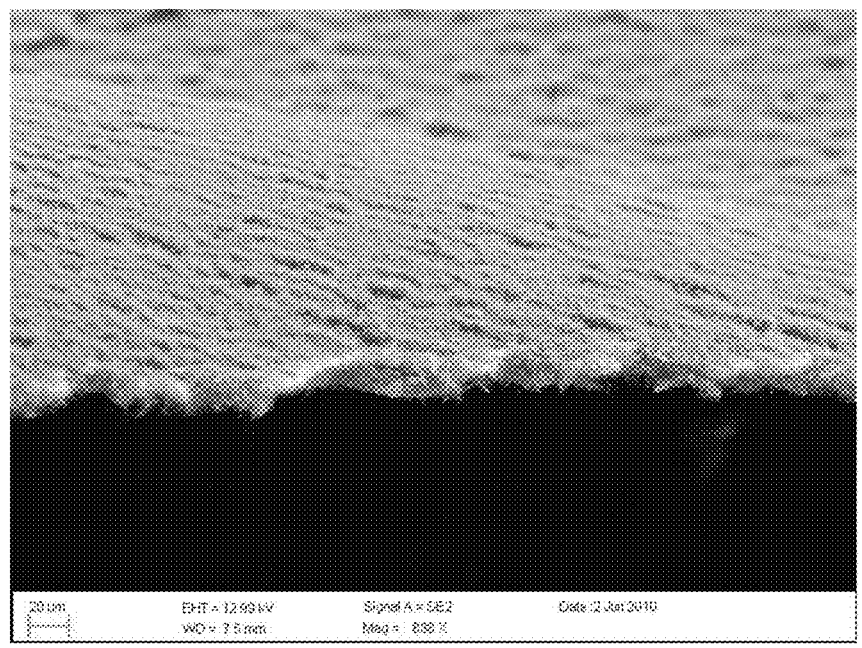

The bottom and top surfaces of the nanowire fabric had slightly different textures. As the SEM images in FIG. 9 show, the side of the fabric that initially interfaces with the filter is much smoother than the top surface. On the top surface, there is the appearance of some nanowire bundling, which became more pronounced for thicker fabric samples. As the fabric becomes thicker, the filtering process slows considerably and nanowires become more susceptible to bundling and aggregation as they are pulled from the solvent onto the fabric surface. Of course, it will be appreciated that it may be possible to reduce this surface roughness with nanowires with better dispersibility, or by optimizing the vacuum pressure.

EXAMPLE 7

This example illustrates another particular, non-limiting embodiment of the preparation of a fabric from semiconductor nanowires via a filtration method.

A dilute dispersion of Si or Ge nanowires (0.1-1 mg/mL) in toluene (or chloroform) is passed through a porous alumina filter with 200 nm pores via vacuum filtration. The resulting nanowire film is air dried for 1 hour and then peeled from the alumina surface, resulting in a freestanding sheet of nanowire fabric. This method produces sheets of fabric with uniform thickness, tunable by the amount of solution passed through the filter. Layered sheets of nanowire fabric can also be produced by passing dispersions of Si and Ge nanowires through the filter in succession. Alternatively, blended Si/Ge fabric may be produced by using a mixed dispersion of Si and Ge nanowires.

EXAMPLE 8

This example illustrates one particular, non-limiting embodiment of the preparation of a fabric from semiconductor nanowires via a PTFE trough method.

A concentrated slurry of Si or Ge nanowires (1-10 mg/mL) in toluene (or chloroform) is placed on the surface of a TEFLON™ trough and allowed to dry. The resulting sheet of nanowire fabric is then peeled from the surface of the trough using a razor blade. This method is able to produce very large sheets of freestanding fabric, as the size of the trough is scalable. A detachable frame serving as the walls of the trough helps facilitate removal of large sheets of fabric. This method can also be used to make layered fabric, or blended Si/Ge fabric.

In some embodiments, it may be desirable to make fabrics or other constructs which comprise doped nanowires. This is especially true for applications where the constructs so produced will be utilized in electronic devices. The following example illustrates one manner in which such doping may be accomplished.

EXAMPLE 9

This example illustrates one particular, non-limiting embodiment of a method for making doped semiconductor nanowires (and in particular, a method for making Ge nanowires doped with phosphorous to make them n-doped). The resulting nanowires may be incorporated into various constructs in accordance with the teachings herein.

(i) Nanowire Growth: A sample of Ge nanowires was grown in a solution of anhydrous benzene (or toluene) containing 15 mg/L gold nanocrystals and 35 mM diphenylgermane. The solution was injected into a titanium reactor at 380° C. that had been pressurized to 1000 psig with anhydrous benzene (or toluene) at a flow rate of 0.5 mL/min.

(ii) Nanowire Surface Functionalization: Following injection, the reactor was sealed and cooled isochorically to 120° C. The reactor was then pressurized using a 10% volume solution of trioctylphosphine oxide (or other tertiary alkylphosphine oxide) dissolved in benzene (or toluene), until a pressure of 1000 psig was reached. The reactor was then sealed and allowed to incubate at 120° C. for 2 hours.

(iii) Dopant Drive-in: After incubation, the reactor temperature was ramped up to 500° C. with the exit valve open, while maintaining a pressure of 1000 psig using a micrometering valve. The reactor was then sealed once again and allowed to cool to 80° C. for alkanethiol passivation (or to 220° C. for alkene passivation).

(iv) Surface passivation: At 80° C., the reactor was pressurized using a 33% volume solution of alkanethiol dissolved in benzene (or toluene), until a pressure of 1000 psig was reached. The reactor was then sealed and allowed to incubate at 80° C. for 2 hours (alternatively, alkenes may be employed using an incubation temperature of 220° C.). After the incubation period ended, the reactor was cooled to room temperature, and the thiol- or alkene-passivated, phosphorus-doped Ge nanowires were collected.

EXAMPLE 10

This example compares some of the physical properties of a nanowire paper (Ge) made in accordance with the teachings herein with the physical properties of typical cellulosic paper.

Typical cellulosic paper (printer grade) is about 120 μm thick and weighs about 90 g/m$^2$. Tissue paper is about 30 μm thick and weighs about 20 g/m$^2$. Paper comprises cellulose pulp, which is polymerized glucose. The density of glucose is about 1.54 g/cm$^3$.

Comparative physical measurements were made on a sample of Ge paper made in accordance with the teachings herein. Ge has a density of about 5.32 g/cm$^3$. Hence, Ge paper is intrinsically 3.5 times heavier than traditional paper. The Ge paper sample was found to be about 15 μm thick, and weighed about 10 g/m$^2$. Since the Ge paper is about 90% air, this measurement is on par with printer grade cellulosic paper.

EXAMPLE 11

This example illustrates one particular, non-limiting embodiment of the construction and performance of a Ge nanowire fabric photodetector in accordance with the teachings herein.

Figure 16:
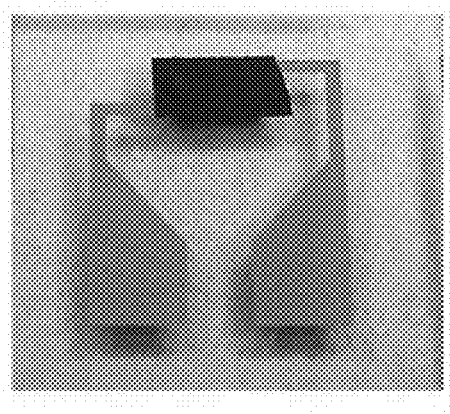
FIG. 16 is a photograph of a photodetector made with a Ge fabric of the type disclosed herein.

A photodetector was assembled using a square swatch of Ge nanowire paper made in accordance with the methodology of EXAMPLE 6, and opposing gold electrodes. The resulting construct is shown in FIG. 16. The electrical current flowing through the nanowire paper was measured in the dark, and then under lighting conditions equal to 1 sun AM 1.5 G. An increase in current was observed when the light is turned on.

Figure 17:
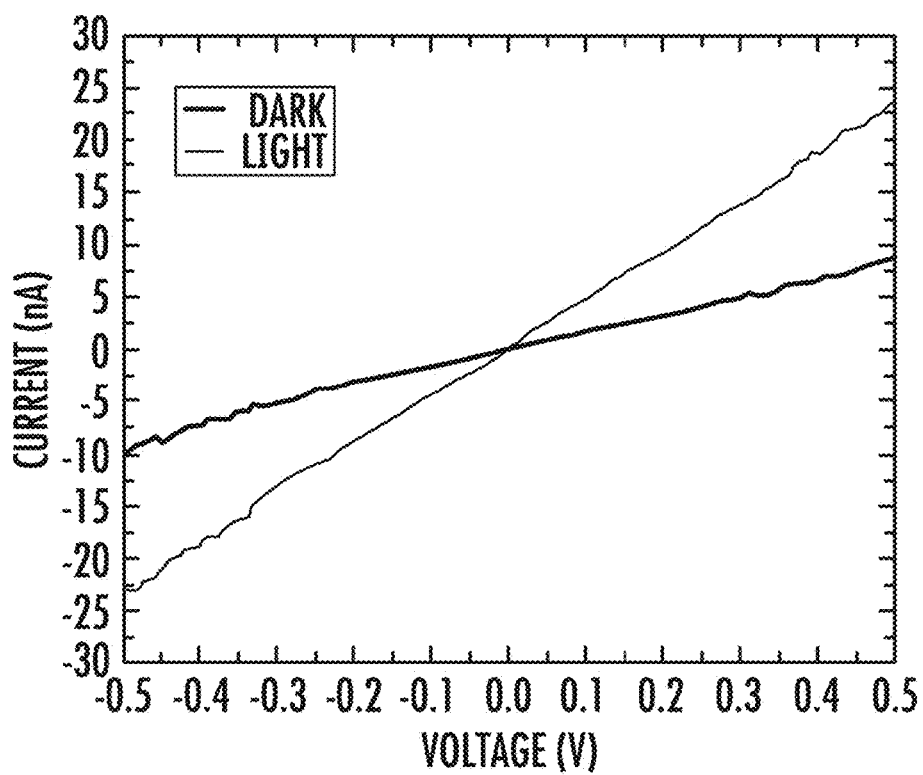
FIG. 17 is a graph of current as a function of voltage for the photodetector of FIG. 16.
Figure 18:
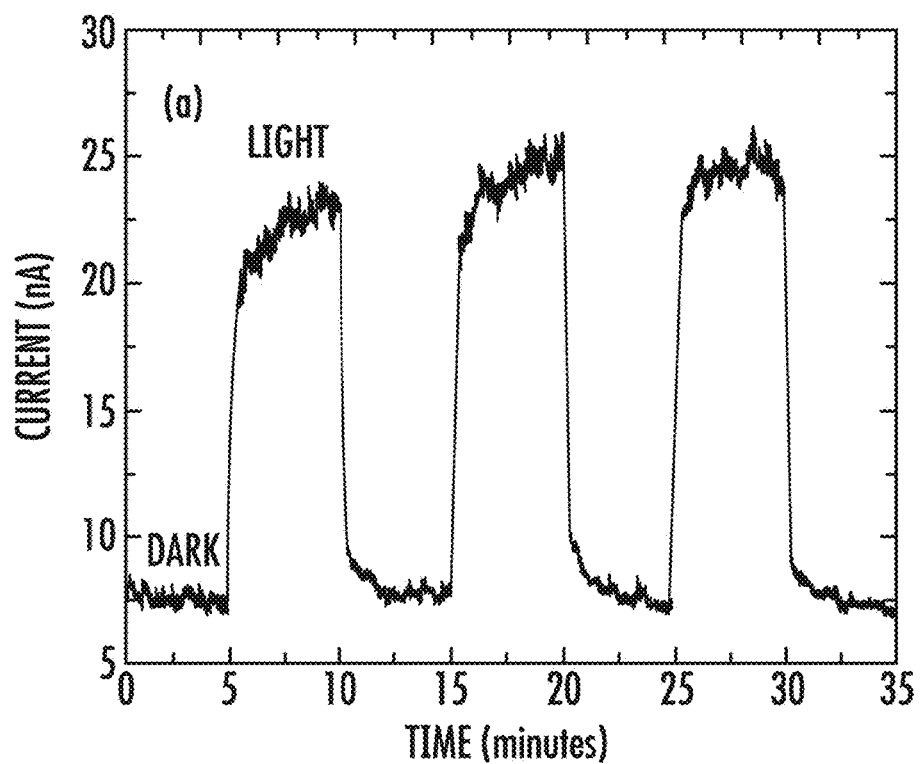
FIG. 18 is a graph of current as a function of time for the photodetector of FIG. 16.
Figure 19:
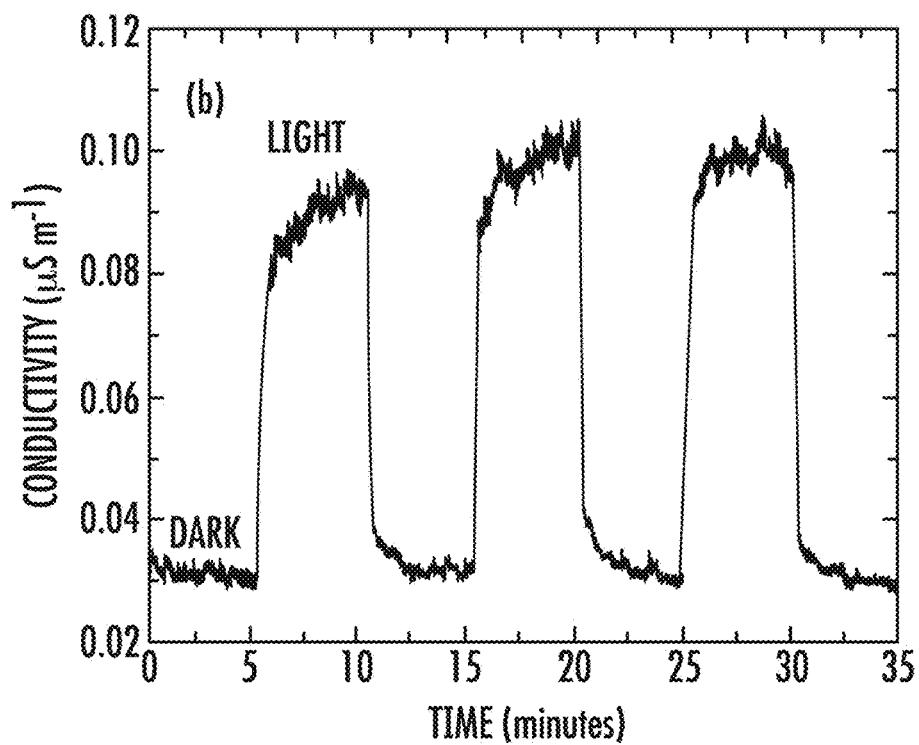
FIG. 19 is a graph of conductivity as a function of time for the photodetector of FIG. 16.

FIG. 17 shows the I-V curves that were measured under dark and light conditions. FIG. 18 shows the corresponding curve for current as a function of time, while FIG. 19 shows the corresponding curve for conductivity as a function of time. As seen therein, the current and conductivity increase under illumination and then decrease under dark conditions. This photoresponse is the basis for an optical detector or sensor.

In some applications, it is desirable to coat, functionalize or passivated nanowires prior to their incorporation into fabrics and various other constructs. In some cases, this may advantageously modify the surface reactivity or physical properties of the nanowires, or may make them more conducive to the processing necessary to form the construct. However, in some cases, it is possible to form coatings on nanowires as a byproduct of the nanowire synthesis process.

For example, it has been observed that, when Si nanostructures (including both nanorods and nanowires) are made by supercritical fluid-liquid-solid (SFLS) growth using gold nanocrystal seeds and monophenylsilane in a continuous flow reactor, as the nanostructures accumulate in the reactor, an amorphous shell begins to form on the nanostructures. This is especially true when the reaction runtime is greater than about 20 min. The shell material has been identified as polyphenylsilane, which is apparently formed by polymerization of phenylsilanes in the reactor. The shell becomes thicker with longer reaction run time. This type of shell formation, and methods for removing the shell, are described in PCT/US10/30990 (Heitsch et al.), "Synthesis of Silicon Nanorods" which is incorporated herein by reference in its entirety. Other shells having other chemistries may be obtained through the use of suitable precursors or reaction conditions.

While the removal of such a shell is desirable in some applications and may be accomplished, for example, through suitable etching techniques (possibly in combination with thermal quenching), in other applications, retention of the shell on the nanowire may be beneficial. Because the shell is formed within the reactor, the underlying nanowire is not exposed to oxygen, as would typically be the case if the nanowires were coated in a post-synthetic, secondary process, and also does a better job of bonding to 100% of the surface of the nanowires. Hence, the shell preserves pure nanowires, and provides a more effective and less expensive means of coating nanowires.

For example, at present, there is considerable focus in the lithium battery industry on trying to enable Si-based anodes. Si-based anodes are desirable because they have the potential to increase the capacitance of lithium ion batteries. Studies have indicated that Si anodes alone could lead to as much as 40% improvement in the battery capacitance. Without wishing to be bound by theory, this is believed to be due to the ability of Si to absorb substantially more lithium than conventional carbon-based anodes ($Si_5Li_{22}$ vs $C_6Li_1$). Silicon will swell 400% (as opposed to about 4% for carbon) due to this abnormally high lithium uptake.

When a Li-Ion battery is turned on (cycled) for the first time, some of the lithium (along with some of the polymer electrolyte, and possibly other materials) absorbs on the surface of the anode, thus creating a solid electrolyte interface (SEI). This phenomenon is not unique to Si-based anodes, but occurs with other commonly used anodic materials, including carbon. Ultimately, the SEI protects the anode from plating in subsequent operational cycles. The lithium in the SEI is unrecoverable (unusable) to the system thereafter, and hence is referred to in the art as "irreversible capacity loss".

While the SEI nature of the SEI is not fully understood, the prevalent view in the art is that it cannot be "coated", but must be grown in the first cycle (and possibly in subsequent cycles). However, this issue may be overcome through the use of nanowires of the type described herein which are coated with a protective, covalently-bonded (e.g., polyphenylsilane) shell. In addition to covering 100% of the surface area of the nanowire, the shell is also flexible. If properly formed, such a shell may be capable of expanding along with silicon when lithiated, may expand without cracking, and may be capable of passing lithium through to the silicon core.

At present, one significant challenge facing silicon-based anodes is that the (conventionally grown) SEI layer breaks apart during expansion. Since the surface area of nanowires is quite large, this phenomenon exposes a significant amount of additional silicon to the electrolyte, which leads to the creation of additional SEI (thus taking even more lithium out of the system). While this problem is more pronounced for nanoparticles than nanowires, even nanowire anodes suffer from massive swelling of the Si and require an SEI layer which is capable of expanding and contracting along with the silicon without cracking.

At present, some attempts have been made to handle the foregoing issue by altering the electrolyte composition so as to make the SEI more flexible, or by making Si composite structures that attempt to dampen or confine the silicon swelling (although this latter approach comes at a cost of precluding some of the lithium uptake and hence reduces capacity potential). By contrast, the wire passivation which may occur as a result of the formation of a shell during nanowire synthesis may preclude the need for a conventionally grown SEI layer, thus allowing the use of existing, proven electrolytes. Moreover, the use of these materials allows the size of the cathode to be reduced, because there is no need to overcompensate for expected lithium losses in the SEI formation. Hence, the use of such passivated nanowires may enable smaller and more cost effective cells.

Such passivated Si nanostructured anodes have two other potential significant benefits. In particular, the naturally passivated structures may prevent lithium (which is highly reactive) from reacting with silicon (which is also highly reactive). In other Si anode systems, such reactivity can cause the electrolyte to break down, creating other species (salts) that bind the lithium and that exhibit poor mobility. Such species inhibit lithium transport by the polymer electrolyte out the anode, and preclude lithium flow in the system. Some attempts have been made to rectify this problem by creating more robust electrolyte binder formulations. However, the shell passivated nanowires described herein have the potential to solve this problem all-together. In particular, the use of such shell passivated materials may allow lithium to transport through the shell to lithiate the silicon without direct contact between the electrolyte and silicon, thus leaving the electrolyte intact.

A further benefit of having a naturally occurring, robust passivation layer of the type that may be achieved by the shell passivation described herein is that it provides in situ protection against oxidation. Silicon readily oxidizes, making it almost impossible to create a cost effective process that utilizes high surface area silicon nanostructures without experiencing some (typically substantial) oxidation. Indeed, oxidation is a significant problem encountered in other attempts to date to use silicon nanostructures as lithium-ion anodes.

In order to combat oxidation, a large voltage is sometimes applied to the anode in the first cycle to remove the oxide layer. While this approach may succeed in at least partially removing the oxide layer, it also requires the electrodes to be over-built to withstand the applied voltage, thus increasing the bulk and expense of the battery. Moreover, this approach may also introduce $SiO_2$ impurities into the system, which may retard the polymer electrolyte's ability to uptake/transport appropriate amounts of lithium. Hence, the use of passivated nanowires of the type described herein avoids or reduces oxidation, and reduces the size of the electrodes (and hence the battery). The production of such nanowires, and experimental evidence of the shell existing on these nanowires, is described further below.

EXAMPLE 12

This example illustrates the synthesis of Si nanowires with polyphenylsilane shell passivation in accordance with the teachings herein.

Si nanowires were synthesized by SFLS growth in supercritical toluene using a continuous flow through reactor. In this example, 2 nm diameter dodecanethiol capped Au nanocrystals were used as the metal seeds, and MPS was used as the silicon precursor. The concentration of MPS in the injection solution was 70 mM, and the Si/Au ratio was 660:1. Anhydrous toluene was used as the solvent.

The precursor solution was injected into the reactor for various reactions run times (10 min to 6 hr) at a rate of 0.5 ml/min. The temperature and pressure were maintained at 490° C. and 10.3 MPa, respectively, during the reaction. For clarification, reaction run time refers to the length of time the precursor solution was continuously fed into the supercritical reactor at a rate of 0.5 ml/min. For example, a run time of 10 min would result in a total reaction solution volume of 5 ml being injected into the reactor. For a 40 min reaction, 20 ml would be injected.

Si nanowires were purified by dispersing ~30 mg of nanowire product with 5 ml of chloroform and then precipitating by centrifuging at 8000 RPM (8228 g RCF) for 5 min at ambient atmosphere. Glass centrifuge tubes were used for all manipulations unless stated otherwise (Kimble 45600-30). After centrifugation, the precipitated Si nanowires were collected by carefully decanting the supernatant. This cleaning process was repeated three times before dispersing the wires in chloroform and storing on the bench top in a capped vial. Time sensitive measurements were taken immediately after clean up.

Figure 26:
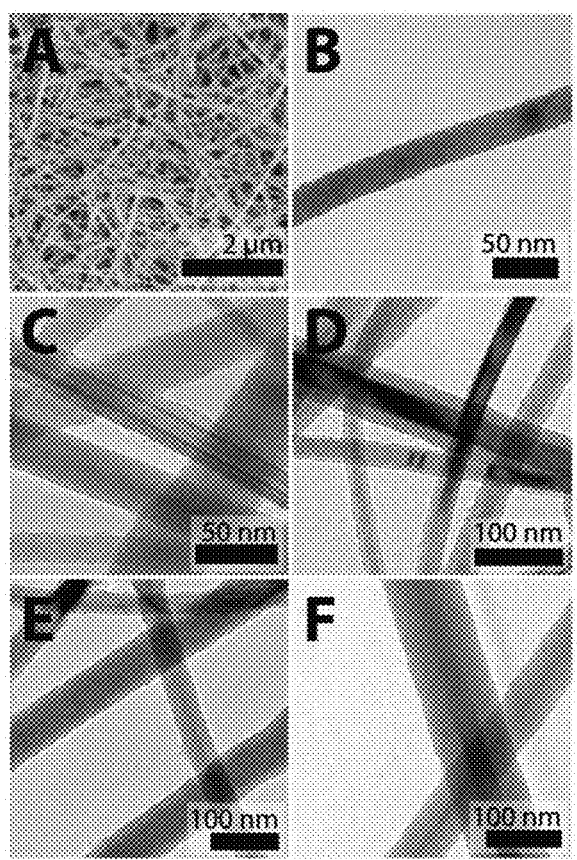
FIG. 26 is an SEM image of Si nanowires obtained from a 40 min reaction, and representative TEM images of Si nanowires after reaction run time of (B) 10 min, (C) 20 min, (D) 40 min, (E) 2 hrs, and (F) 6 hrs.
Figure 27:
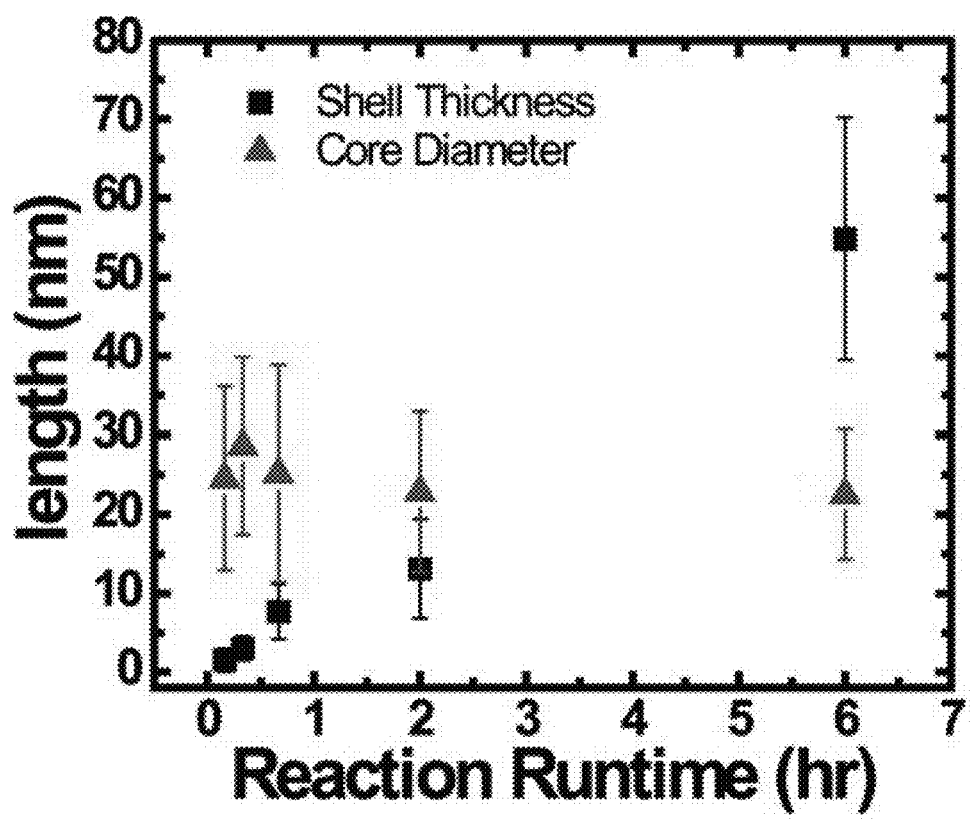
FIG. 27 is a plot of the average amorphous shell thickness and crystalline core diameter as a function of reaction run time. Averages are based on the measurement of 100 nanowires per sample.

FIG. 26 shows SEM and TEM images of Si nanowires synthesized by decomposing monophenylsilane (MPS) in the presence of gold nanocrystals in supercritical toluene at 490° C. and 10.3 MPa. The reactions were carried out by continuously feeding the reactant solution of Au nanocrystals and MPS in toluene into a heated reactor at 0.5 ml/min, with reaction run times of 10 min (B), 20 min (C), 40 min (D), 2 hrs (E), and 6 hrs (F). FIG. 37 is a graph of the average amorphous shell thickness and crystalline core diameter as a function of reaction time run, with averages based on the measurement of 100 nanowires per sample.

As indicated by this data, the coating was significantly thicker in nanowire samples made with longer reaction run times. FIG. 26 shows examples of nanowires obtained after longer reaction run times. After 10 min, the nanowires had only a very thin amorphous shell that was 1-2 nm thick on average, and some nanowires that were free of the shells. Increased reaction run times of 20 min led to all nanowires having shells, which were approximately 3.0 nm thick. Run times of 6 hr led to shells that were nearly 60 nm thick (see TABLE 1). These data are consistent with shell growth occurring throughout the reaction.

There was also more variation in shell thickness with longer reaction run times, indicating that nanowires formed earlier in the process and having the longest residence time in the reactor, accumulate the thickest shells. The average diameter of the crystalline Si core, however, was not affected by the run time. Regardless of run time, the average diameter was 25 nm. The nanowire length was also unaffected by the reaction run time. The continuous addition of gold nanocrystals and MPS to the reactor leads to steady-state nucleation and growth of additional nanowires that end up at just over 20 μm in length, with the total mass of nanowire product increasing with reaction run time, as summarized in TABLE 2. After a 6 hr reaction run time, the reactor is completely filled with 185 mg of a porous mesh of nanowires that are slightly longer than 20 μm on average and relatively free of kinks

TABLE 2

Summary of nanowire product as a function of reaction run time.

| Run Time (min) | Mass of Product (mg) | Nanowire Core Diameter (nm) | Shell Thickness (nm) | Color |
|---|---|---|---|---|
| 10 | 3.0 | 24.51 ± 11.6 | 1.1 ± 1.0 | Brown |
| 20 | 8.5 | 28.59 ± 11.2 | 3.01 ± 1.58 | Yellow/Brown |
| 40 | 28 | 25.1 ± 13.7 | 7.7 ± 3.5 | Yellow/Brown |
| 120 | 55 | 22.8 ± 10.1 | 13.1 ± 6.3 | Yellow/Brown |
| 360 | 185 | 22.48 ± 8.2 | 54.8 ± 15.35 | Yellow/Brown |

Even though the dimensions of the crystalline Si nanowires did not change with reaction run time, the color of the nanowire product differed, becoming more yellow as the shell thickness increased. Short run times of 10-40 min yield a product with a brownish yellow color, while longer reactions of 120 min or more yielded a bright yellow product. This color difference is related to the relative thickness of the amorphous coating on the nanowires.

Figure 28:
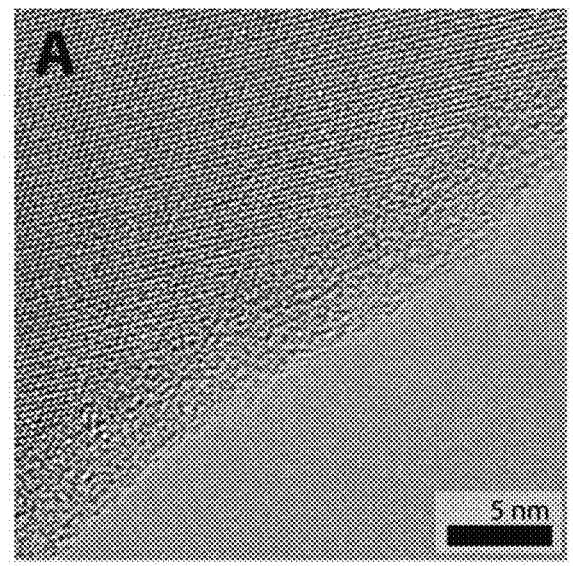
FIG. 28 high resolution TEM image of a Si nanowire obtained after a 40 min run time with a 4.3 nm thick polyphenylsilane shell. The predominant nanowire growth direction observed by TEM was <111>, which is consistent with previous reports for Au nanocrystal-seeded SFLS Si nanowire growth.
Figure 29:
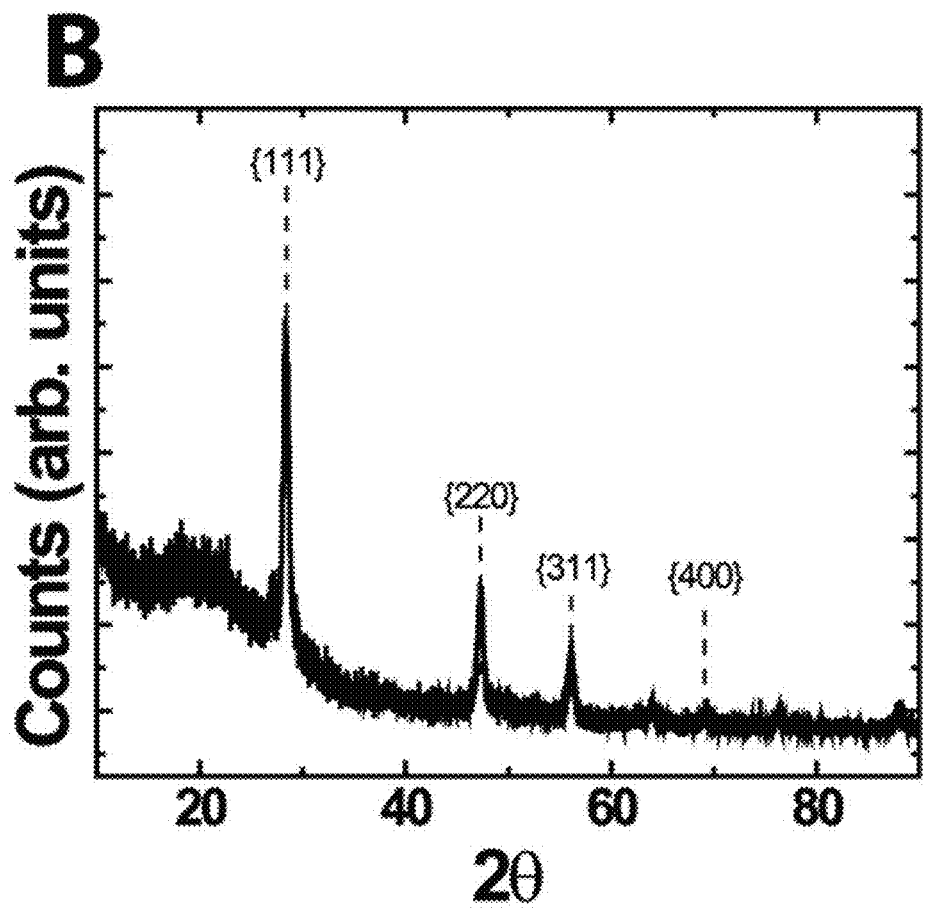
FIG. 29 is an XRD of Si nanowires obtained after a 40 min run time. The diffraction pattern indexes to diamond cubic Si (PDF #027-1402). The broad peak at 2θ≈21° is from the amorphous coating around the nanowires.

XRD and HRTEM imaging confirmed that the nanowires are composed of crystalline Si, but also indicated a significant amorphous shell on most of the nanowires, especially at the longer reaction times. Thus, FIG. 28 shows an HRTEM of a nanowire sample made with a 40 min run time. The crystalline core of the nanowire is clearly visible, and has an amorphous shell that is 4.3 nm thick. The predominate nanowires growth direction observed by TEM was <111>, which is consistent with previous reports for Au nanocrystal-seeded SFLS Si nanowires growth. In the XRD of the sample shown in FIG. 29, the diffraction pattern indexes to diamond cubic Si (PDF #027-1402), and the amorphous coating is seen to give rise to a broad peak at $2\theta \approx 21°$.

EXAMPLE 16

This example illustrates the results of the analytical techniques, including those described in EXAMPLE 15, used to determine the chemical composition of the shell formed on Si nanowires as described in EXAMPLE 12.

Figure 30:
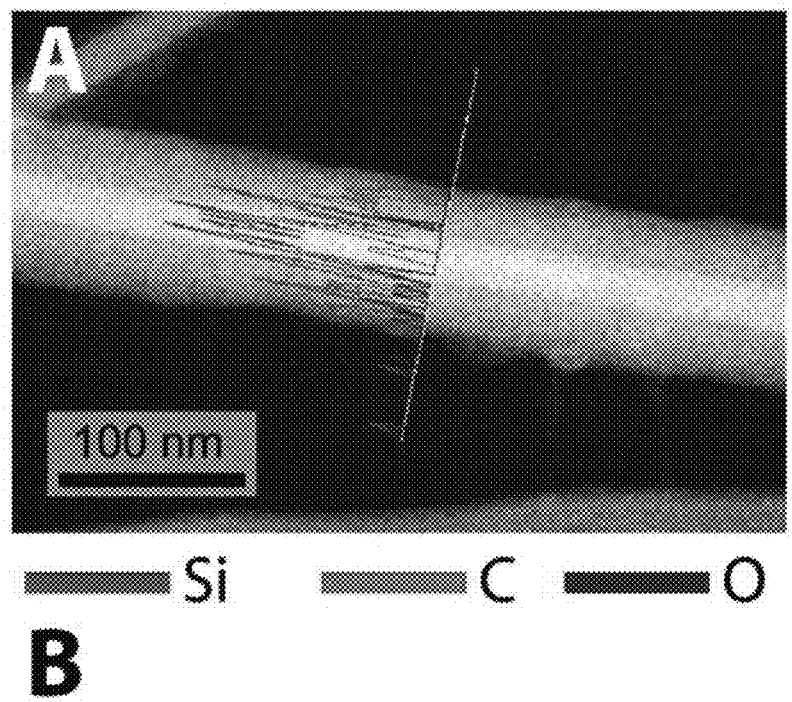
FIG. 30 is an EDS line scan across a Si nanowire from a 6 hr run time reaction. The crystalline core diameter is 24.5 nm and the amorphous shell thickness is 35.2 nm. The counts from Si, C, and O are graphed on the line scan.

Analytical results indicated that the shell is composed of polymerized phenylsilane. Thus, FIG. 30 shows a nanobeam EDS line scan across a core-shell Si nanowire taken from a 6 hr run time reaction. The crystalline core diameter was found to be 24.5 nm and the amorphous shell thickness was determined to be 35.2 nm. The counts from Si, C and O are graphed on the line scan. The Si signal was strongest when the beam was positioned within the crystalline core of the nanowire. When the beam was positioned in the shell, the Si signal decreased in intensity and a large carbon signal was detected. A very small oxygen signal was detected in the shell, with no other detectable elements.

The shell is composed of Si and C, with very little oxygen, and ATR-FTIR spectra revealed that the most of the carbon in the sample is present as a phenylated silane. For example, the FTIR spectra of nanowires obtained from a 40 min reaction run time with an average shell thickness of 8 nm (see FIG. 32) exhibited characteristic aromatic C=C stretching at 1430 and 1595 cm-1, aromatic C—H stretching at 3080-3010 cm-1, aromatic C—H out-of-plane deformation bands at 695 and 740 cm-1, and X-sensitive band at 1100 cm-1 due to the interaction of the in-plane aromatic ring vibration and stretching vibration of the (aromatic carbon) —Si bond. Significant amounts of Si—H is also observed (Si—H vibrations at 2100 cm-1), which would be expected along the backbone of a polyphenylsilane polymer.

Figure 33:
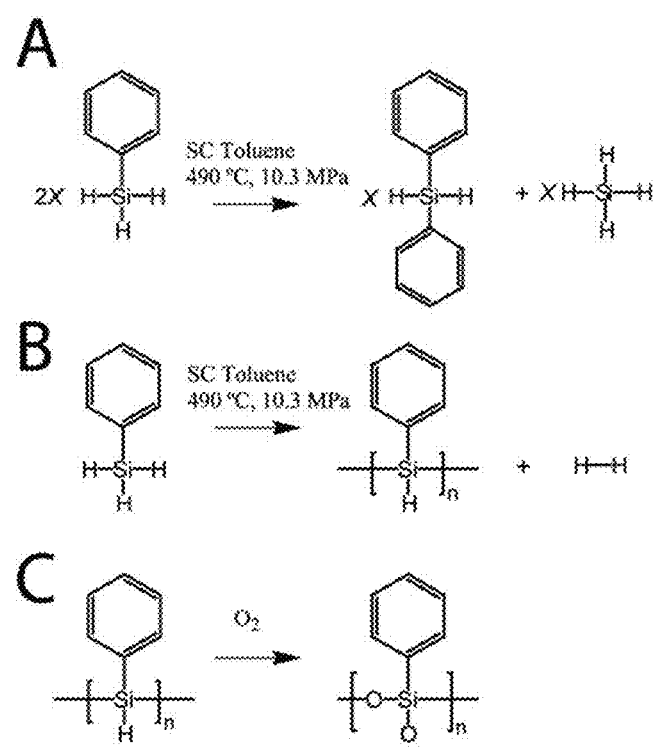
FIG. 33 is a reaction diagram showing: (A) MPS disproportionation to diphenylsilane and silane. Two diphenylsilanes can react further to produce triphenylsilane and MPS (reaction not shown). (B) Reaction of MPS to polyphenysilane and hydrogen. (C) Oxidation of polyphenylsilane upon oxygen exposure.

The polyphenylsilane shell is a byproduct of MPS decomposition. Phenylsilane reacts by phenyl redistribution to silane ($SiH_4$) and higher order phenylsilanes as illustrated in FIG. 33. $SiH_4$ decomposes to Si for nanowire formation, whereas higher order phenylsilanes are reaction byproducts. Mass spectroscopy of the reaction effluent confirmed the presence of the phenylsilane disproportionation products, diphenylsilane and triphenylsilane, respectively. MPS and higher order phenylsilanes can polymerize, and in this case, deposit over the course of the reaction on the nanowire surfaces.

Figure 31:
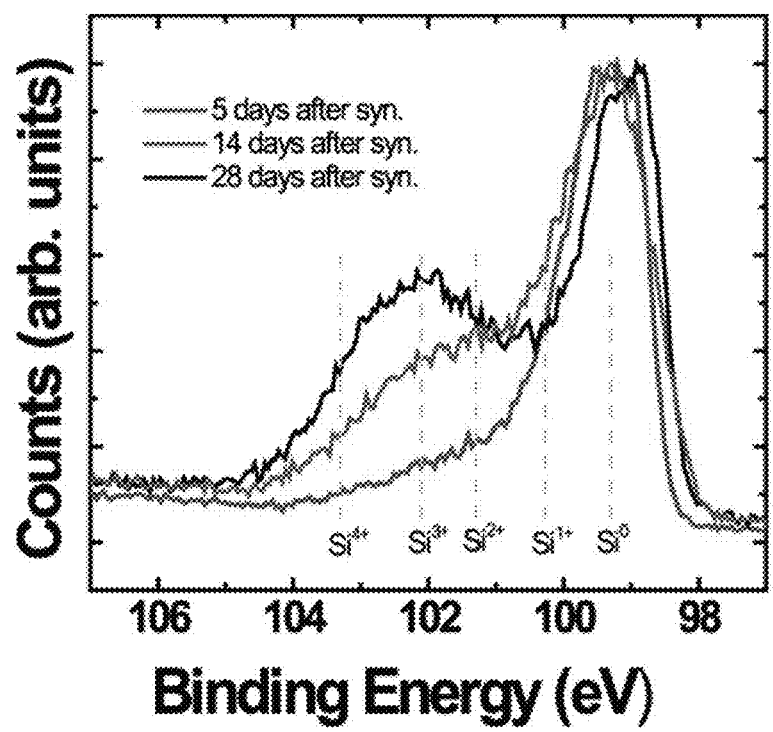
FIG. 31 is an XPS spectra of the Si2p region for Si nanowires taken from a 40 min run time reaction. Core-shell Si nanowires were exposed to ambient conditions on the bench top for 5, 14, and 28 days.
Figure 32:
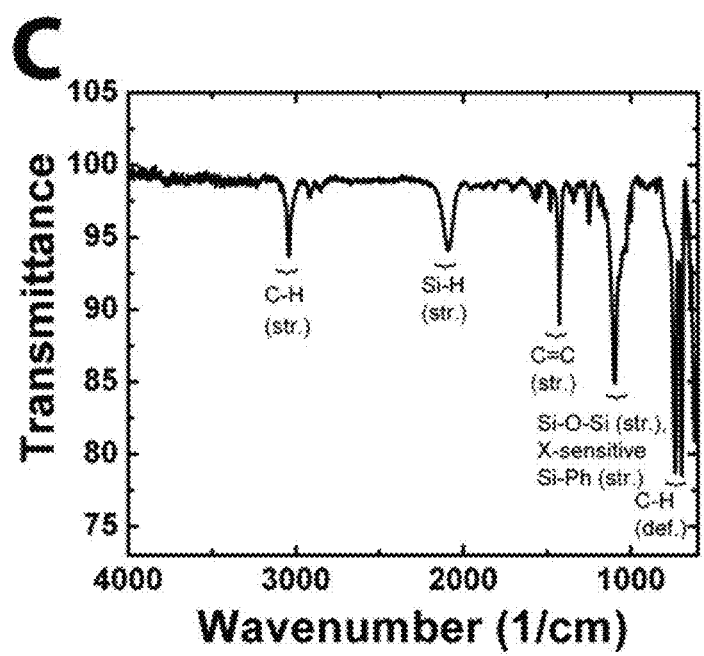
FIG. 32 is an ATR-FTIR of Si nanowires taken from a 40 min run time reaction. Nanowires from a 40 min reaction had an average amorphous shell thickness of 7.7 nm and average crystalline core diameter of 25.1 nm.

XPS data of nanowires exposed to air are also consistent with the nanowires being coated with a polyphenylsilane shell. Thus, FIG. 31 shows XPS data of Si nanowires obtained from reactions run for 40 min after exposure to air. There is an intense peak in the Si2p binding region at ~99.3 eV, and after 5 days in air there is a relatively weak shoulder from a combination of oxidized Si species: Si1+ at 100.3 eV, Si2+ at 101.3 eV, Si3+ at 102.1 eV, and Si4+ at 103.3 eV. The majority of the oxidized silicon species has an oxidation state less than 4. After two weeks in air, the Si3+ peak at 102.1 eV in the XPS grew significantly, which is consistent with literature reports for slow oxidation of polysilanes to polysiloxanes with oxygen exposure at room temperature. Oxygen incorporates into the Si back-bone of the polymer, creating a siloxane (Si—O—Si) catenation to create an $SiO_2C_2$ bonding environment with an Si binding energy of 101.9 eV. ATR-FTIR spectra also showed the presence of Si—O species; for example, the width of the peak from 1100-1000 cm-1 is due to asymmetric Si—O—Si stretching (FIG. 32).

Prolonged exposure to air causes the intensity of the Si—O—Si peak to increase and overshadow the X-sensitive band from the Si-Ph bond at 1100 cm-1. A slow oxidation is also typical of amorphous Si, however, its oxidation results in $SiO_2$ (103.3 eV), which was not observed by XPS.26 In comparison, Si nanowires that have had their shells removed (see detailed discussion below) and were then exposed to air, oxidize primarily to $SiO_2$. For example, the XPS (FIG. 30D) exhibits a significant peak at 103.3 eV corresponding to Si with an oxidation state of +4.

Polyphenlysilanes are typically synthesized by Wurtz-type coupling of dichlorosilanes ($R^1R^2SiCl_2$) with sodium or by catalytic dehydrocoupling of primary silanes ($RSiH_3$) with transition metal catalysts (Zr, Ti, and Hf metallocenes). These reactions can proceed at relatively mild temperature and pressure, however, there is no catalyst in the nanowire growth reaction. Nonetheless, it appears that the relatively high temperature and pressure used to grow the Si nanowires (490° C. and 10.3 MPa) can induce phenylsilane polymerization.

The lithium batteries described herein preferably utilize electrolytes containing lithium ions. The anodes for these batteries may comprise lithium metal (lithium batteries), but more preferably comprise compositions that intercalate lithium (lithium ion batteries). The compositions that intercalate lithium, for use in the cathodes, generally are chalcogenides such as metal oxides that can incorporate the lithium ions into their lattice.

Figure 34:
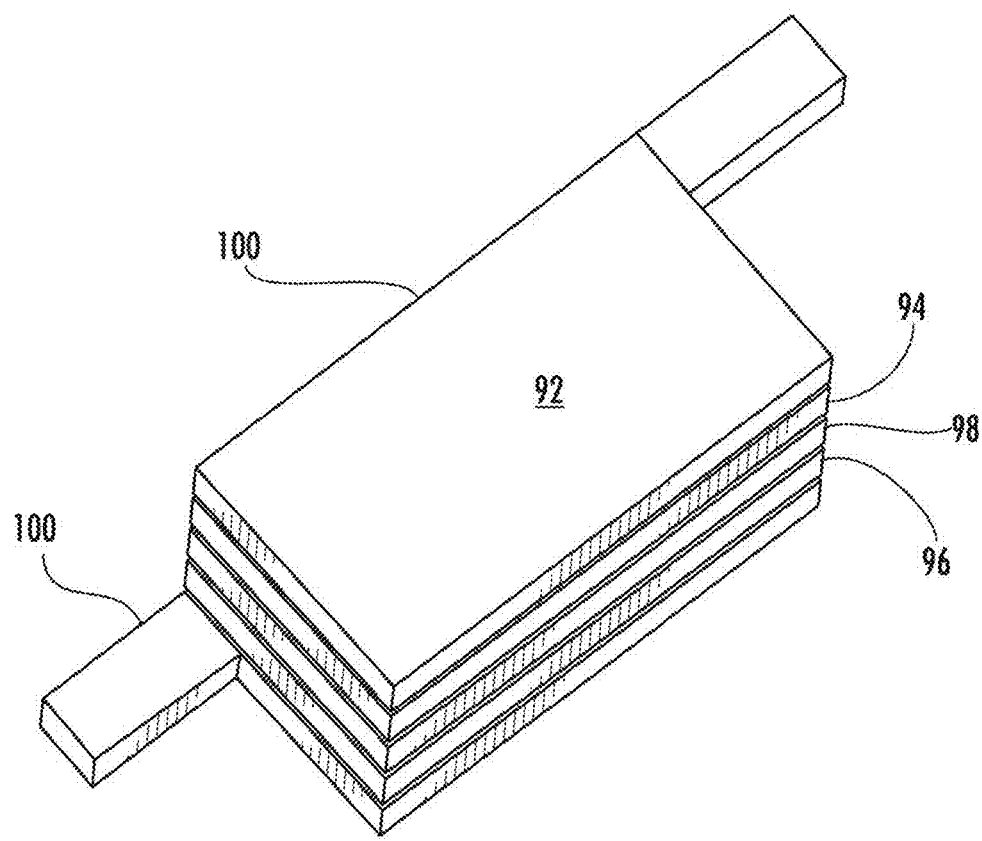
FIG. 34 depicts a schematic of an embodiment of a battery based on the nanoparticles described herein.

FIG. 34 depicts a particular, non-limiting embodiment of a battery 92 based on the nanowires described herein. The battery 92 includes an anode 94, a cathode 96 and separator 98 between anode 94 and cathode 96. A single battery may include multiple cathodes and/or anodes. Electrolyte can be supplied in a variety of ways as described further below.

Lithium has been used in reduction/oxidation reactions in batteries because they are the lightest metal and because they are the most electropositive metal. Metal oxides are known to incorporate lithium ions into their lattice structure through intercalation or similar mechanisms such as topochemical absorption. Thus, many metal oxides may be effective as an electroactive material for a cathode in either a lithium or lithium ion battery.

Lithium intercalated metal oxides are formed in the battery during discharge. The lithium leaves the lattice upon recharging, i.e., when a voltage is applied to the cell such that electric current flows into the cathode due to the application of an external current to the battery. Intercalation generally is reversible, making metal oxide based lithium batteries suitable for the production of secondary batteries.

In one embodiment, cathode 96 may include electroactive nanoparticles held together with a binder. Any of the nanoparticles described herein may be used in cathode 96 for lithium battery 92. However, the use in the cathode of semiconductor nanowires is preferred. More preferably, semiconductor nanowires are utilized which have a shell of the type described herein, and most preferably semiconductor nanowires are utilized which have a shell of the type described herein and which have been assembled into a fabric. The nanoparticles which are utilized may be held together with a binder to produce cathode 96. The cathode 96 may also include a mixture of different types of nanoparticles.

Cathode 96 optionally may include electrically conductive particles in addition to the electroactive nanoparticles. These supplementary, electrically conductive particles generally are also held by the binder. Suitable electrically conductive particles include conductive carbon particles such as carbon black, metal particles such as silver particles and the like. These particles may also be nanoparticles, produced by any of the methods described herein.

High loadings of nanoparticles can be achieved in the binder. Nanoparticles may make up greater than about 80 percent by weight of the cathode, and in some embodiments greater than about 90 percent by weight. The binder may be any of various suitable polymers such as polyvinylidene fluoride, polyethylene oxide, polyethylene, polypropylene, polytetrafluoroethylene, polyacrylates and mixtures and copolymers thereof.

Anode 94 of battery 92 may be constructed from a variety of materials that are suitable for use with lithium ion electrolytes. In the case of lithium batteries 92, anode 94 can include lithium metal or lithium alloys, which may be in the form of a foil, grid or metal particles in a binder.

Lithium ion batteries use particles having a composition that may intercalate lithium. The particles may be held with a binder in the anode. Suitable intercalation compounds include, for example, graphite, synthetic graphite, coke, mesocarbons, doped carbons, fullerenes, niobium pentoxide and tin oxide, Lithium batteries may also include collectors 100 that facilitate flow of electricity from the battery. Collectors 100 are electrically conductive and may be made of metal such as nickel, iron, stainless steel, aluminum and copper and may be metal foil or preferably a metal grid. Collector 100 may be on the surface of their associated electrode or embedded within their associated electrode.

Separator 98 is an electrically insulating material that provides for passage of at least some types of ions. Ionic transmission through the separator provides for electrical neutrality in the different sections of the cell. Separator 98 generally prevents electroactive compounds in cathode 96 from contacting electroactive compounds in anode 94.

A variety of materials may be used for separator 98. For example, separator 98 may be formed from glass fibers that form a porous matrix. Alternatively, separators 98 may be formed from polymers such as those suitable for use as binders. Polymer separators may be porous to provide for ionic conduction. Alternatively, polymer separators may be solid electrolytes formed from polymers such as polyethylene oxide. Solid electrolytes incorporate electrolyte into the polymer matrix to provide for ionic conduction without the need for liquid solvent.

Electrolytes for lithium batteries or lithium ion batteries may include any of a variety of lithium salts. In some embodiments, lithium salts have inert anions and are non-toxic. Suitable lithium salts include, but are not limited to, lithium hexafluorophosphate, lithium hexafluoroarsenate, lithium bis(trifluoromethyl sulfonyl imide), lithium trifluoromethane sulfonate, lithium tris(trifluoromethyl sulfonyl) methide, lithium tetrafluoroborate, lithium perchlorate, lithium tetrachloroaluminate, lithium chloride and lithium perfluorobutane.

If a liquid solvent is used to dissolve the electrolyte, the solvent may be inert and may not dissolve the electroactive materials. Generally appropriate solvents include, but are not limited to, propylene carbonate, dimethyl carbonate, diethyl carbonate, 2-methyl tetrahydrofuran, dioxolane, tetrahydrofuran, 1,2-dimethoxyethane, ethylene carbonate, gamma.-butyrolactone, dimethyl sulfoxide, acetonitrile, formamide, dimethylformamide and nitromethane.

The shape of the battery components may be adjusted to be suitable for the desired final product, for example, a coin battery, a rectangular construction or a cylindrical battery. The battery generally includes a casing with appropriate portions in electrical contact with current collectors and/or electrodes of the battery. If a liquid electrolyte is used, the casing inhibits the leakage of the electrolyte. The casing may help to maintain the battery elements in close proximity to each other to reduce resistance within the battery. A plurality of battery cells may be placed in a single case with the cells connected either in series or in parallel. Further general information regarding the structure and formation of lithium batteries may be found in U.S. Pat. No. 6,130,007 (Bi et al.), entitled "Batteries with Electroactive Nanoparticles", which is incorporated herein by reference.

The nanowires made in accordance with the teachings herein may be used to make a variety of articles which may be used for a variety of purposes. For example, the nanowires may be pressed, drawn, oriented, spun, wound or otherwise assembled into various clothes, yarns, strings, filaments, ropes, cords, fabrics, films, papers, mats, fibrous substrates, porous substrates or the like. The nanowires may be treated, coated, or impregnated, either during or after formation, with various coatings, binders, resins, waxes, oils, spin finishes, sizing agents, biological agents, pharmaceutical agents, and immunological agents. In some embodiments, the nanowires may also be mixed with one or more different types of fibers, carbon nanotubes, nanostructures or nanoparticles.

Sheets of the nanowires made in accordance with the teachings herein may also be used to create various composite articles. For example, in some embodiments, a sheet of nanowires may be disposed between a sheet of thermoplastic material and a suitable release liner, or between two sheets of the same or different thermoplastics. The resulting composite may be subjected to heat treatment, lamination, curing or the like to produce a processed composite article.

In other embodiments, a sheet of nanowires formed in accordance with the teachings herein may be formed or disposed upon a release liner. The release liner may comprise a suitable carrier or web material and a suitable release agent. The choice of release agent may depend, for example, on the solvent system used to form the nanowires, especially if some of the solvent will be present when the nanowires are disposed on the release liner. However, release agents comprising a fluoropolymer, and especially PTFE, is preferred. The material of the carrier or web may comprise various polymeric materials such as, for example, polyethylene terephthalate (PET), polyethylene naphthalate (PEN), or polytetrafluoroethylene (PTFE).

In other embodiments, the nanowires may be mixed with a curable material that is curable upon exposure to a suitable radiation source such as, for example, a UV or e-beam radiation source. The curable material may further comprise other ingredients as are known to the art including, for example, various suitable crosslinking agents, radiation adsorbing materials, fillers, plasticizers, pigments, dyes and the like.

In some embodiments, the capping agent may be suitably functionalized to form at least part of a coating or matrix that is desired in the final article or composition. For example, the capping agent may include one or more reactive groups which are capable of reacting with each other or with one or more monomers or polymers to form a variety of compositions or articles.

In other embodiments, the capping agent may facilitate the incorporation into, or blending of, the nanowires with another material. For example, in some embodiments, the capping agent may be chosen to make the nanowires miscible with, or adherent to, a sizing agent used to form paper-like sheets out of the nanowires.

Various sizing agents may be used in the formation of nanowire fabrics, papers, films and constructs in accordance with the teachings herein, and include both surface sizing agents and internal sizing agents. Suitable surface sizing agents will typically be amphipathic materials with hydrophilic and hydrophobic moieties or ends, and may be applied as solutions of modified starches or hydrocolloids such as gelatine and a surface sizing agent such as AKD or acrylic co-polymers. Suitable internal sizing agents include materials such as alkenylsuccinic anhydride, alkyl ketene dimer, and rosin, and typically serve to make the resulting fabric more hydrophobic.

Various polymeric materials may be utilized in the formation of nanowire fabrics, papers, films, composites, and other constructs in accordance with the teachings herein. These include, without limitation, various hydrophobic, hydrophilic and fluorophilic polymeric materials and coatings, which may be organic or inorganic. Some particular, non-limiting examples of fluorophilic polymeric materials and coatings include those based on various forms of polytetrafluoroethylene (PTFE). These polymeric materials may be surfactants or lipids, amphiphilic, diblock or triblock polymers, and may be grafted covalently or physisorbed on the nanowire surface. The nanowires described herein may be embedded in, coated, blended or mixed with these polymeric materials. In some embodiments, the nanowires described herein may be wound or intertwined with polymeric or glass fibers to form various types of cables, cords or ropes, or wires having a variety of physical and optical properties.

Some specific, non-limiting examples of polymeric resins and materials which may be utilized in the constructs described herein include polyesters, polyethers, polyalkylenes, polyamides, bisphenol A polymers, epoxy resins, formaldehyde copolymers, poly(phenylene oxide) resins, polysulfones, and polyurethanes. Some specific, non-limiting examples of the foregoing include polyethylene, polypropylene, nylon, acetal resins, polycarbonates, nitrile rubbers, polychloroprene, polybutadiene, styrene-butadiene, fluorinated rubbers, neoprene, PVC, polystyrene, polyethylene, polypropylene, polyacrylonitrile, PVB, and silicone rubbers.

Depending on their end use, the nanowires made in accordance with the teaching herein may also be implanted with various species including, but not limited to, phosphorus, boron, gallium, indium, arsenic and antimony. Nanowires may also be doped or alloyed with transition metals such as, for example, Cu, Ni, Co, Fe, Mn, W, Ti, Mo, Ta, Pt and Pd. Such implantation may occur before or after the nanowires are incorporated into a fabric, and may be used to manipulate the physical, mechanical or electrical properties of the nanowires. The dopant impurity may be added by ion implantation or by thermally-driven diffusion from an external source, such as an impurity-doped glass or a metal substrate. In some cases, the dopant may be added by adsorbing molecular layers containing the dopant, followed by a thermal anneal to drive in the dopant.

The various articles and constructs made in accordance with the teachings herein which incorporate the nanostructures described herein have a wide variety of end uses. For example, a variety of optical films (including films that act as mirrors or polarizers at desired wavelengths) or other optical bodies may be formed which incorporate the nanostructures. As a particular, non-limiting example, the nanostructures may be treated with a capping agent which binds to polyester monomers or polymers such as polyethylene naphthalate (PEN), polyethylene terephthalate (PET) or the like. The resulting nanostructures may then be mixed with one or more suitable polyester monomers or polymers and extruded or cast as a film to form a variety of continuous/disperse phase optical films. A variety of mechanical or engineering films may be made in a similar manner.

One potential end use of the fabrics described herein is in rechargeable batteries, and in particular, in lithium ion batteries. In such devices, these materials may be utilized, for example, as the anode material. The use of Si nanowires is especially preferable in this application. In some cases, the nanowires may have a polyphenylsilane shell, which may enhance certain aspects of the battery such as cyclability and durability.

In some embodiments, the fabric may comprise a mixture of Group IV nanowires and carbon nanotubes. In other embodiments, the fabric may comprise a mixture of Group IV nanowires and a carbon binder. The nanowires may be doped or alloyed (for example, to form silicides) with various dopants and metals. In some applications, the use of dopants which are transition metals is preferred, while in other applications, the use of dopants such as boron, phosphorous and arsenic may be utilized.

The compositions and methodologies may also be applied to other end uses. These include, without limitation, their use as, or incorporation into, sponges, the time release of drugs or pharmaceutical compositions, antimicrobial coatings, self-cleaning coatings, water-resistant and breathable membranes, scaffolds for cell growth, catalyst scaffolds, abrasion-resistant coatings, thermoelectric devices, thermal management devices and components, RFID sensors, smart, intelligent or advanced textiles or fabrics, devices for the conversion of solar energy to fuels, and photovoltaic cells and materials.

Various seed materials may be used in the methodologies and compositions described herein. These include, without limitation, seed materials based on Au, Ni, Cu, Bi and Fe. The seed materials are preferably nanocrystals.

While much of the discussion herein has pertained to nanowires, it will be appreciated that the methods and compositions described herein may also utilize other structures such as, for example, nanotubes. Moreover, the nanowires utilized in the compositions and methodologies disclosed herein may have various degrees of straightness or kinkiness, which may be chosen in light of the intended application.

Various types of nanowires may be utilized in the processes, devices and constructs made in accordance with the teachings herein. These include, without limitation, nanowires comprising Ge, Si, InP, and $CuInSe_2$. Preferably, the nanowires comprise at least one Group IV element such as silicon, germanium, tin, lead, or various combinations thereof.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

APPENDIX A

References

[1] Clarke, D. R. In *The Mechanical Properties of Semiconductors*; Faber, K. T., Malloy, K. J., Eds.; Academic Press, Inc.: San Diego, Calif., 1992; Vol. 37.

[2] Pearson, G. L.; Read, W. T.; Feldmann, W. L. *Acta. Metall.* 1957, 5, 181.

[3] Barrett, C. R.; Nix, W. D.; Tetelman, A. S. *The Principles of Engineering Materials*; Prentice-Hall, Inc.: Englewood Cliffs, N.J., 1973.

[4] Macmillan, N. H. *J. Mater. Sci.* 1972, 7, 239.

[5] Claeys, C. *Germanium-Based Technologies: From Materials to Devices*; Elsevier Science: Oxford, 2007.

[6] Macmillan, N. H. *J. Mater. Sci.* 1972, 7, 239.
[7] Claeys, C. *Germanium-Based Technologies: From Materials to Devices*; Elsevier Science: Oxford, 2007.
[8] *Handbook of Optical Constants of Solids*, Edward D. Palik, 1985, Academic Press, NY.
[9] Hanrath, T.; Korgel, B. A. *J. Am. Chem. Soc.* 2002, 124, 1424.
[10] Hanrath, T.; Korgel, B. A. *Adv. Mater.* 2003, 15, 437.
[11] Pearson, G. L.; Read, W. T.; Feldmann, W. L. *Acta. Metall.* 1957, 5, 181.
[12] , F. M.; Lee, D. C.; Fanfair, D. D.; Korgel, B. A. *J. Phys. Chem. C* 2007, 111, 2929.
[13] Hanrath, T.; Korgel, B. A. *J. Am. Chem. Soc.* 2002, 124, 1424
[14] Hanrath, T.; Korgel, B. A. *Adv. Mater.* 2003, 15, 437.
[15] Hanrath, T.; Korgel, B. A. *J. Am. Chem. Soc.* 2004, 126, 15466.
[16] Ngo, L. T.; Almecija, D.; Sader, J. E.; Daly, B.; Petkov, N.; Holmes, J. D.; Erts, D.; Boland, J. J. *Nano Lett.* 2006, 6, 2964.
[17] Hoffmann, S.; Utke, I.; Moser, B.; Michler, J.; Christiansen, S. H.; Schmidt, V.; Senz, S.; Werner, P.; Gosele, U.; Gallif, C. *Nano Lett.* 2006, 6, 622.
[18] Zheng, K.; Han, X.; Wang, L.; Zhang, Y.; Yue, Y.; Qin, Y.; Zhang, X.; Zhang, Z. *Nano Lett.* 2009, 9, 2471.
[19] Han, X.; Zheng, K.; Zhang, Y. F.; Zhang, X.; Zhang, Z.; Wang, Z. L. *Adv. Mater.* 2007, 19, 2112.
[20] Xu, G. In *Dislocations in Solids*; Nabarro, F. R. N., Hirth, J. P., Eds.; North Holland, 2004; Vol. 12, p 83.
[21] Ruoff, R. S.; Qian, D.; Liu, W. K. *C. R. Physique* 2003, 4, 993-1008.
[22] Hanrath, T.; Korgel, B. A. *J. Am. Chem. Soc.* 2004, 126, 15466.
[23] Hoffmann, S.; Utke, I.; Moser, B.; Michler, J.; Christiansen, S. H.; Schmidt, V.; Senz, S.; Werner, P.; Gosele, U.; Gallif, C. *Nano Lett.* 2006, 6, 622.
[24] Ruoff, R. S.; Qian, D.; Liu, W. K. *C. R. Physique* 2003, 4, 993-1008.
[25] Smith, D. A.; Holmberg, V. C.; Lee, D. C.; Korgel, B. A. *J. Phys. Chem. C* 2008, 112, 10725.
[26] Kumar, S.; Wang, Y. In *Composites Engineering Handbook*; Mallick, P. K., Ed.; Marcel Dekker, Inc.: New York, 1997.
[27] Smith, D. A.; Holmberg, V. C.; Lee, D. C.; Korgel, B. A. *J. Phys. Chem. C* 2008, 112, 10725.
[28] Ruoff, R. S.; Lorents, D. C. *Carbon* 1995, 33, 925.
[29] Law, M.; Goldberger, J.; Yang, P. *Annu. Rev. Mater. Res.* 2004, 34, 83.
[30] Wong, E. W.; Sheehan, P. E.; Lieber, C. M. *Science* 1997, 277, 1971.
[31] Lee, B.; Rudd, R. E. *Phys. Rev. B* 2007, 75, 041305.
[32] He, R.; Yang, P. *Nature* 2006, 1, 42.
[33] Wong, E. W.; Sheehan, P. E.; Lieber, C. M. *Science* 1997, 277, 1971.
[34] Harold, S. P.; Cai, W.; Espinosa, H. D.; Huang, H. *MRS Bull.* 2009, 34, 178.
[35] Ngo, L. T.; Almecija, D.; Sader, J. E.; Daly, B.; Petkov, N.; Holmes, J. D.; Erts, D.; Boland, J. J. *Nano Lett.* 2006, 6, 2964.
[36] Wong, E. W.; Sheehan, P. E.; Lieber, C. M. *Science* 1997, 277, 1971.
[37] Hsin, C. L.; Mai, W.; Gu, Y.; Gao, Y.; Huang, C. T.; Liu, Y.; Chen, L. J.; Wang, Z. L. *Adv. Mater.* 2008, 20, 1.
[38] Wu, B.; Heidelberg, A.; Boland, J. J. *Nature* 2005, 4, 525.
[39] Smith, D. A.; Holmberg, V. C.; Lee, D. C.; Korgel, B. A. *J. Phys. Chem. C* 2008, 112, 10725.
[40] Chen, X.; Zhang, S.; Wagner, G. J.; Ding, W.; Ruoff, R. S. *J. Appl. Phys.* 2004, 95, 4823.
[41] Mechanical measurements were performed using a Zyvex S100 nanomanipulation system inside of a FEI Strata 235 dual beam SEM/FIB system. Tungsten probes were made by electrochemically etching tungsten wire (Goodfellow, 0.25 mm, 99.95% purity) in 2 M KOH at a bias of 4 V. The nanomanipulator was used to bend nanowires until fracture or to a high strain position. Video of specimen manipulation was obtained by splitting the monitor signal and capturing on a separate computer using a VGA2USB VGA capture device from Epiphan Systems Inc. The video was recorded at a frame rate faster than the SEM scan rate of 0.34 frames per second.
[42] Hanrath, T.; Korgel, B. A. *J. Am. Chem. Soc.* 2002, 124, 1424.
[43] Hanrath, T.; Korgel, B. A. *Adv. Mater.* 2003, 15, 437.
[44] Brust, M.; Walker, M.; Bethell, D.; Schiffrin, D. I.; Whyman, R. *J. Chem. Soc., Chem. Commun.* 1994, 801.
[45] Holmberg, V. C.; Rasch, M. R.; Korgel, B. A. *Langmuir* 2010, in press.
[46] Hanrath, T.; Korgel, B. A. *J. Am. Chem. Soc.* 2004, 126, 15466.
[47] Holmberg, V. C.; Rasch, M. R.; Korgel, B. A. *Langmuir* 2010, in press
[48] Holmberg, V. C.; Rasch, M. R.; Korgel, B. A. *Langmuir* 2010, in press
[49] Polyakov, B.; Daly, B.; Prikulis, J.; Lisauskas, V.; Vengalis, B.; Morris, M. A.; Holmes, J. D.; Erts, D. *Adv. Mater.* 2006, 18, 1812.
[50] Holmberg, V. C.; Rasch, M. R.; Korgel, B. A. *Langmuir* 2010, in press
[51] Yurkin, M. A.; Hoekstra, A. G. *J. Quant. Spectrosc. Ra.* 2007, 106, 558.
[52] Draine, B. T. *Astrophysical J.* 1988, 333, 848.
[53] Draine, B. T.; Flatau, P. J. *J. Opt. Soc. Am. A* 1994, 11, 1491.
[54] *CRC Handbook of Chemistry and Physics: Optical Properties of Selected Elements*, Weaver, J. H.; Frederikse, H. P. R., 2010, 91st Ed., 12-127.
[55] Draine, B. T. *Astrophysical J.* 1988, 333, 848.
[56] Draine, B. T.; Flatau, P. J. *J. Opt. Soc. Am. A* 1994, 11, 1491.
[57] Podolskiy, V. A. *J. Nonlinear Opt. Phys.* 2002, 11, 65.
[58] Agarwal, R.; Lieber, C. M. *Appl. Phys. A-Mater.* 2006, 85, 209-215.
[59] Wang, J.; Gudiksen, M. S.; Duan, X.; Cui, Y.; Lieber, C. M. *Science* 2001, 293, 1455.
[60] Cao, L.; White, J. S.; Park, J. S.; Schuller, J. A.; Clemens, B. M.; Brongersma, M. L. *Nat. Mater.* 2009, 8, 643.
[61] Chen, G.; Wu, J.; Lu, Q.; Gutierrez, H. R.; Xiong, Q.; Pellen, M. E.; Petko, J. S.; Werner, D. H.; Eklund, P. C. *Nano Lett.* 2008, 8, 1341.
[62] Bashouti, M.; Salalha, W.; Brumer, M.; Zussman, E.; Lifshitz, E. *ChemPhysChem* 2006, 7, 102.
[63] *CRC Handbook of Chemistry and Physics: Optical Properties of Selected Elements*, Weaver, J. H.; Frederikse, H. P. R., 2010, 91st Ed., 12-127.
[64] Cao, L.; White, J. S.; Park, J. S.; Schuller, J. A.; Clemens, B. M.; Brongersma, M. L. *Nat. Mater.* 2009, 8, 643.
[65] Cao, L.; Park, J. -S.; Fan, P.; Clemens, B.; Brongersma, M. L. *Nano Lett.* 2010, 10, 1229-1233.
[66] Muskens, O. L.; Rivas, J. G.; Algra, R. E.; Bakkers, E. P. A. M.; Lagendijk, A. *Nano Lett.* 2008, 8, 2638.
[67] Hu, L.; Chen, G. *Nano Lett.* 2007, 7, 3249.

[68] Muskens, O. L.; Diedenhofen, S. L.; Weert, M. H. M.; Borgstrom, M. T.; Bakkers, E. P. A. M.; Rivas, J. G. *Adv. Funct. Mater.* 2008, 18, 1039.

[69] Tsakalakos, L.; Balch, J.; Fronheiser, J.; Shih, M. Y.; LeBoeuf, S. F.; Pietrzykowski, M.; Codella, P. J.; Korevaar, B. A.; Sulima, O.; Rand, J.; Davuluru, A.; Rapol, U. *J. Nanophotonics* 2007, 1, 013552.

[70] Cao, L.; White, J. S.; Park, J. S.; Schuller, J. A.; Clemens, B. M.; Brongersma, M. L. *Nat. Mater.* 2009, 8, 643.

[71] Cao, L.; Park, J. -S.; Fan, P.; Clemens, B.; Brongersma, M. L. *Nano Lett.* 2010, 10, 1229-1233.

[72] Hanrath, T.; Korgel, B. A. *J. Am. Chem. Soc.* 2002, 124, 1424.

[73] Hanrath, T.; Korgel, B. A. *Adv. Mater.* 2003, 15, 437.

[74] Hanrath, T.; Korgel, B. A. *J. Am. Chem. Soc.* 2004, 126, 15466.

[75] Roesler, J.; Harders, H.; Baeker, M. *Mechanical Behaviour of Engineering Materials*; Springer: New York, 2007.

[76] Smith, D. A.; Holmberg, V. C.; Lee, D. C.; Korgel, B. A. *J. Phys. Chem. C* 2008, 112, 10725.

[77] Macmillan, N. H. *J. Mater. Sci.* 1972, 7, 239

[78] Roundy, D.; Cohen, M. L. *Phys. Rev. B* 2001, 64, 212103.

[79] Tabib-Azar, M.; Nassirou, M.; Wang, R. *Appl. Phys. Lett.* 2005, 87, 113102.

[80] Gordon, M. J.; Baron, T.; Dhalluin, F.; Gentile, P.; Ferret, P. *Nano Lett.* 2009, 9, 525.

[81] Namazu, T.; Isono, Y.; Tanaka, T. J. *Microelectromech. S.* 2000, 9, 450.

[82] Pearson, G. L.; Read, W. T.; Feldmann, W. L. *Acta. Metall.* 1957, 5, 181.

[83] Han, X.; Zheng, K.; Zhang, Y. F.; Zhang, X.; Zhang, Z.; Wang, Z. L. *Adv. Mater.* 2007, 19, 2112.

[84] Menon, M.; Srivastava, D.; Ponomareva, I.; Chemozatonski, L. A. *Phys. Rev. B* 2004, 70, 125313.

[85] Oliver, D. J.; Bradby, J. E.; Williams, J. S. *J. Appl. Phys.* 2007, 101, 043524.

What is claimed is:

1. A fabric, comprising:
a self-supporting mass containing a plurality of semiconductor nanowires comprising Ge;
wherein an otherwise identical mass consisting only of the semiconductor nanowires is also self-supporting, wherein the nanowires are coated with a capping agent that passivates the nanowires, wherein the nanowires have an optical absorption $\varepsilon_{N1}$ at $\lambda_1$ where $\lambda_1 \geq 760$ nm, wherein Ge has a bulk absorption $\varepsilon_{B1}$ at $\lambda_1$, wherein $\varepsilon_{N1} > \varepsilon_{B1}$, wherein the capping agent comprises at least one alkene or thiol ligand, wherein each of said plurality of semiconducting nanowires has an aspect ratio, defined as the ratio of the length of the nanowire to the width of the nanowire, which is greater than 1000, and wherein each of said plurality of semiconducting nanowires has a diameter which is less than 200 nm.

2. The fabric of claim 1, wherein the fabric has a density of less than 10% of the density of the bulk material.

3. The fabric of claim 1, wherein the fabric has a thickness of at least 7 microns.

4. The fabric of claim 1, wherein the fabric further comprises Si nanowires.

5. The fabric of claim 1, wherein the fabric consists essentially of said nanowires.

6. The fabric of claim 1, wherein the nanowires are doped with copper.

7. The fabric of claim 6, wherein the concentration of copper is at least 0.01% by weight, based on the total weight of the nanowire.

8. The fabric of claim 1, wherein the fabric comprises said nanowires mixed with carbon nanotubes.

9. The fabric of claim 1, wherein the fabric comprises said nanowires mixed with nanofibers that do not comprise a Group IV element.

10. The fabric of claim 1, wherein the fabric comprises said nanowires mixed with polymeric fibers.

11. The fabric of claim 1, wherein the fabric comprises said nanowires mixed with cellulosic fibers.

12. The fabric of claim 1, wherein the fabric comprises said nanowires mixed with textile fibers.

13. The fabric of claim 1, wherein the fabric comprises said nanowires which have been doped with a dopant at a concentration of at least 0.01% by weight of a dopant, based on the total weight of the nanowires.

14. The fabric of claim 13, wherein said dopant is electrically active.

15. The fabric of claim 13, wherein the dopant is selected from the group consisting of phosphorous and boron.

16. A rechargeable battery, comprising:
an anode;
a cathode; and
an electrolyte;
wherein at least one of said anode and said cathode of said rechargeable battery comprises the fabric of claim 1.

17. The rechargeable battery of claim 16, wherein said anode comprises said fabric.

18. The rechargeable battery of claim 16, wherein said rechargeable battery is a lithium ion battery, and wherein said anode comprises said fabric.

19. The rechargeable battery of claim 16, wherein each of said nanowires contains a shell.

20. The rechargeable battery of claim 19, wherein each shell comprises an organometallic material.

21. The fabric of claim 1, wherein said semiconductor nanowires have a diameter of 10-30 nm.

22. The fabric of claim 1, wherein each of said plurality of semiconducting nanowires has a diameter which is less than 100 nm.

23. The fabric of claim 1, wherein each of said plurality of semiconducting nanowires has a diameter which is within the range of 10 nm to 90 nm.

24. A self-supporting mass comprising semiconductor nanowires; wherein an otherwise identical mass consisting only of the semiconductor nanowires is also self-supporting, wherein said nanowires comprise Ge, wherein said nanowires are coated with a capping agent, wherein the capping agent has the formula $(R)_n$-X, wherein X is an atom or functional group capable of binding to the surface of the nanowires, wherein each R moiety is independently hydrogen or an alkyl or aryl group having from 1 to 20 carbon atoms, wherein the nanowires have an optical absorption $\varepsilon_{N1}$ at $\lambda_1$, where $\lambda_1 \geq 760$ nm, wherein the material has a bulk absorption $\varepsilon_{B1}$ at $\lambda_1$, and wherein $\varepsilon_{N1} > \varepsilon_{B1}$, wherein each of said plurality of semiconducting nanowires has an aspect ratio, defined as the ratio of the length of the nanowire to the width of the nanowire, which is greater than 1000, and wherein each of said plurality of semiconducting nanowires has a diameter which is less than 100 nm.

25. The self-supporting mass of claim 24, wherein said self-supporting mass is a paper product.

26. The self-supporting mass of claim 25, wherein the product is semiconducting.

27. The self-supporting mass of claim 24, wherein the self-supporting mass is in the form of a sheet.

28. A fabric, comprising:
a self-supporting mass containing a plurality of semiconductor nanowires comprising Ge;

wherein nanowires are doped with copper, wherein the nanowires are coated with a capping agent that passivates the nanostructures, wherein the nanowires have an optical absorption $\varepsilon_{N1}$ at $\lambda_1$, where $\lambda_1 \geq 760$ nm, wherein Ge has a bulk absorption $\varepsilon_{B1}$ at $\lambda_1$, and wherein $\varepsilon_{N1} > \varepsilon_{B1}$, and wherein the capping agent comprises at least one alkene or thiol ligand; and wherein the concentration of copper is at least 0.01% by weight, based on the total weight of the nanowire, wherein each of said plurality of semiconducting nanowires has an aspect ratio, defined as the ratio of the length of the nanowire to the width of the nanowire, which is greater than 1000, and wherein each of said plurality of semiconducting nanowires has a diameter which is less than 100 nm.

29. A fabric, comprising:
   a self-supporting mass containing a plurality of semiconductor nanowires comprising Si or Ge;
wherein an otherwise identical mass consisting only of the semiconductor nanowires is also self-supporting, wherein each of said plurality of semiconducting nanowires has an aspect ratio, defined as the ratio of the length of the nanowire to the width of the nanowire, which is greater than 1000, and said plurality of semiconducting nanowires have an average diameter which is less than 200 nm.

30. The fabric of claim 29, wherein the nanowires are coated with a capping agent that passivates the nanowires.

31. The fabric of claim 29, wherein the nanowires have an optical absorption $\varepsilon_{N1}$ at $\lambda_1$, where $\lambda_1 \geq 760$ nm, wherein Ge has a bulk absorption $\varepsilon_{B1}$ at $\lambda_1$, wherein $\varepsilon_{N1} > \varepsilon_{B1}$.

* * * * *